United States Patent [19]
Kamaya

[11] Patent Number: 5,680,343
[45] Date of Patent: Oct. 21, 1997

[54] SEMICONDUCTOR MEMORY HAVING MASK ROM THAT CAN BE SET TO PLURALITY OF THRESHOLD LEVELS

[75] Inventor: Michinori Kamaya, Tokyo, Japan

[73] Assignee: NEC Corporation, Tokyo, Japan

[21] Appl. No.: 604,847

[22] Filed: Feb. 22, 1996

[30] Foreign Application Priority Data

Feb. 28, 1995 [JP] Japan ................................. 7-039863
Sep. 4, 1995 [JP] Japan ................................. 7-226585

[51] Int. Cl.$^6$ ................................................ G11C 11/56
[52] U.S. Cl. .................... 365/104; 365/185.03; 365/45; 365/189.07; 365/184; 365/168
[58] Field of Search ............................ 365/104, 168, 365/45, 184, 185.03, 189.01, 189.07, 210, 189.11

[56] References Cited

U.S. PATENT DOCUMENTS

| | | | |
|---|---|---|---|
| 4,202,044 | 5/1980 | Beilstein, Jr. et al. | 365/184 |
| 4,586,163 | 4/1986 | Koike | 365/184 |
| 5,163,021 | 11/1992 | Mehrotra et al. | 365/185.03 |
| 5,262,984 | 11/1993 | Noguchi et al. | 365/45 |
| 5,412,601 | 5/1995 | Sawada et al. | 365/184 |
| 5,424,978 | 6/1995 | Wada et al. | 365/184 |

FOREIGN PATENT DOCUMENTS

| | | |
|---|---|---|
| 56-153582 | 11/1981 | Japan . |
| 58-46798 | 3/1983 | Japan . |

*Primary Examiner*—Tan T. Nguyen
*Attorney, Agent, or Firm*—Whitham, Curtis, Whitham & McGinn

[57] ABSTRACT

A semiconductor memory includes a memory transistor having a gate connected to a word line and having a threshold level selected from a plurality of threshold levels, and a plurality of comparison transistors having gates are respectively connected to the word line, each of the comparison transistor having a threshold level selected from the reference threshold levels and the threshold levels of the comparison transistor being different from each other. The word line is driven respectively to a plurality of voltage levels, and whenever they are driven to respective values of the plurality of voltage levels, the logical level state determined based on the difference between the current flowing in the memory transistor and the current flowing in the transistor circuit is held, and multibit data stored in the memory transistor is output based on the logical level state held.

20 Claims, 17 Drawing Sheets

| Threshold of Memory Tr | Level of Word line $W_0$ | $MCT_{00}$ | $H_{00}$ | $H_{01}$ | $H_{02}$ | Output $(D_1 D_2)$ |
|---|---|---|---|---|---|---|
| $V_{T0}$ | $V_1$ | ON | ON | OFF | OFF | (0, 0) |
| $V_{T1}$ | $V_2$ | ON | ON | ON | OFF | (1, 0) |
| $V_{T2}$ | $V_3$ | ON | ON | ON | ON | (0, 1) |
| $V_{T3}$ | $V_3$ | OFF | ON | ON | ON | (1, 1) |

FIG. 4

SEMICONDUCTOR MEMORY HAVING MASK ROM THAT CAN BE SET TO PLURALITY OF THRESHOLD LEVELS

BACKGROUND OF THE INVENTION

The present invention relates to a semiconductor memory and more particularly, to a so-called mask ROM in which each of MOS transistors as memory cells is programmed during fabrication process thereof.

Normally, in a mask ROM, each memory cell consists of one MOS memory transistor, and the conductive state and non-conductive state of a selected memory transistor correspond to data "1" and "0" (or "0" and "1"), respectively. However, each memory transistor thus constructed can store only 1-bit data.

Therefore, a technique has been proposed in which each memory transistor is formed to have one of a plurality of thresholds for the purpose of storing a plurality of bit-data. For example, by forming each memory transistor to have one of four thresholds, it becomes possible to equivalently store a 2-bit data per one memory cell.

Now, what is of importance here is how to detect, namemly how to sense, which one of the plurality of thresholds each memory transistor is set to.

One of the techniques for the sensing is disclosed in Japanese Laid-Open Patent Publication SHO No. 58-46798. Referring to FIG. 18, this technique will be described.

In the figure, $Q_1$ to $Q_4$ are MOS transistors which are respectively serving as memory cells. The threshold voltage of each memory cell is different from that of another memory cell depending upon information to be stored, and they may be set, for example, to satisfy the relation $V_{th1} > V_{th2} > V_{th3} > V_{th4}$ where $V_{th1}$, $V_{th2}$, $V_{th3}$, and $V_{th4}$ are the thresholds of the memory cells Q1, Q2, Q3, and Q4, respectively. These thresholds can be attained by varying the amount of ion implantation to the channel region of the MOS transistor, the thickness of the gate oxide film, and the like at the time of device manufacture.

In the reading of information, namely, in the sensing operation, first, all the word lines and the bit-lines are precharged by bringing the P terminals of a word line precharging circuit 21 and a bit line precharging circuit 22 to a high level. Next, in order to select the memory cell $Q_1$, the gate of a switching transistor TR3 is sent to a high level to bring the potential of a word line W1 to zero by discharging the electrical charge accumulated on the line. As a result, the voltages between the gate and the source of the memory cells $Q_1$ and $Q_2$ become higher than the respective threshold voltages and both cells are turned on. The charges accumulated on bit lines $B_{L1}$ and $B_{L2}$ are thus discharged and their potentials start to go down. Since, however, the gates of the memory cells are respectively connected to the bit lines, neither the potential of the bit line $B_{L1}$ goes down to below the threshold $V_{th1}$ of the memory cell $Q_1$ nor the potential of the bit line $B_{L2}$ goes down to below the threshold $V_{th2}$ of the memory cell $Q_2$. Here, when a switching transistor TR1 is turned on to select the bit line $B_{L1}$, the charge accumulated in the input wiring circuit of an A/D converter 23 is discharged through the switching transistor TR1, memory cell $Q_1$, word line $W_1$, and switching transistor TR3, and the input terminal of the A/D converter 23 goes to $V_{th1}$. A digital value corresponding to the threshold $V_{th1}$ is sent out from the output of the converter 23, and this signal is output as information of the memory cell $Q_1$ after being stored in an output buffer circuit 24.

When one cycle of this operation is completed, after turning off every switching transistor, digital information corresponding to the threshold stored in each memory cell is taken out by carrying out the precharging and the same read operation as in the above.

A method of driving the potential of a selected word line stepwise is disclosed in Japanese Patent Application Disclosure SHO No. 56-153582 as another sensing system.

Referring to FIG. 19, this sensing system of the memory cell will be described. Here, FIG. 19(a) is a basic circuit diagram for one memory transistor and FIG. 19(b) is a timing chart for the circuit.

A reference numeral 201 is a P-channel MISFET, and 203 is an N-channel MISFET as a memory transistor. The threshold of the MISFET 203 is set to one of a plurality of thresholds.

At the time of sensing, first, a word line 206 is brought to the ground level for which the memory cell transistor will not be energized. MISFET 201 is energized by bringing a gate signal $\phi P$ to a low potential. A bit line 208 changes to a voltage level $V_{DD}$ of a power supply. Next, the MISFET 201 is deenergized by bringing the gate signal $\phi P$ to a high potential.

Next, the voltage level of the word line 206 is changed to $V_{G1}$. When the threshold of the MISFET 203 is lower than the voltage $V_{G1}$, the transistor 203 is energized, the charge on the bit line 208 is discharged to the ground via the MISFET, and the bit line 208 goes to a low level (referred to as L hereinafter, and similarly, a high level will have occasions later to be referred to as H). In this state, the logical level of the bit line 208 is read to a 2-bit shift register 210 by a first clock pulse of a clock signal $\phi$ to the shift register 210. Next, the level of the word line 206 is changed to $V_{G2}$. In the above example, the MISFET 203 remains energized and the bit line 208 stays at L.

In this state, a second pulse of the clock signal $\phi$ is generated as shown in FIG. 19(b), and the logical level of the bit line 208 is read to shift register 210. As a result, the 2-bit shift register 210 holds data (L, L). In other words, the memory cell transistor stores the two bits of (0,0).

However, in the sensing system as shown in FIG. 18, the voltage levels of the bit lines $B_{L1}$ and $B_{L2}$ are converted to digital values by the A/D converter, where the operation requires an A/D converter with high precision in order to be able to detect small changes in the voltage values. Such an A/D converter has a problem in that it is bound to have an intricate configuration, a large chip size, and a long conversion time.

On the other hand, in the sensing system as shown in FIG. 19, it is necessary for the memory cell itself to reduce the voltage of the precharged bit line 208 still a voltage lower than the threshold of the shift register, which results in a problem that the read rate is low.

SUMMARY OF THE INVENTION

It is the main object of this invention to provide a semiconductor memory device which is capable of carrying out high speed sensing for a multilevel memory cell transistor.

The read only memory according to this invention includes at least one word line, at least one memory transistor with its gate connected to the word line and having a threshold selected from among a plurality of thresholds, a transistor circuit having a plurality of transistors for comparison with their gates respectively connected to the word line, respectively having thresholds that are mutually different and are selected from among a plurality of thresholds, a voltage driving means for respectively driving the voltages between the gate and the source of the memory transistor and the transistors for comparison to a plurality of voltages, and a sensing circuit connected to the memory transistor and the transistors for comparison, for outputting multibit data stored in the memory transistor based on the logical level stage derived by the difference between the current flowing in the memory transistor and the current flowing in the transistor circuit whenever the transistors are driven to respective ones of the plurality of voltages.

Besides, another read only memory of this invention drives the virtual ground lines consisting of metallic wirings, instead of driving the word lines stepwise.

BRIEF DESCRIPTION OF THE DRAWINGS

The above and other objects, advantages, and features of the present invention will be more apparent from the following description taken in conjunction with the accompanying drawings, in which:

FIG. 4 is a chart showing the relation between the thresholds of the memory transistors and the levels of the word line $W_0$;

DETAILED DESCRIPTION OF THE PREFERRED EMBODIMENTS

Figure 1:
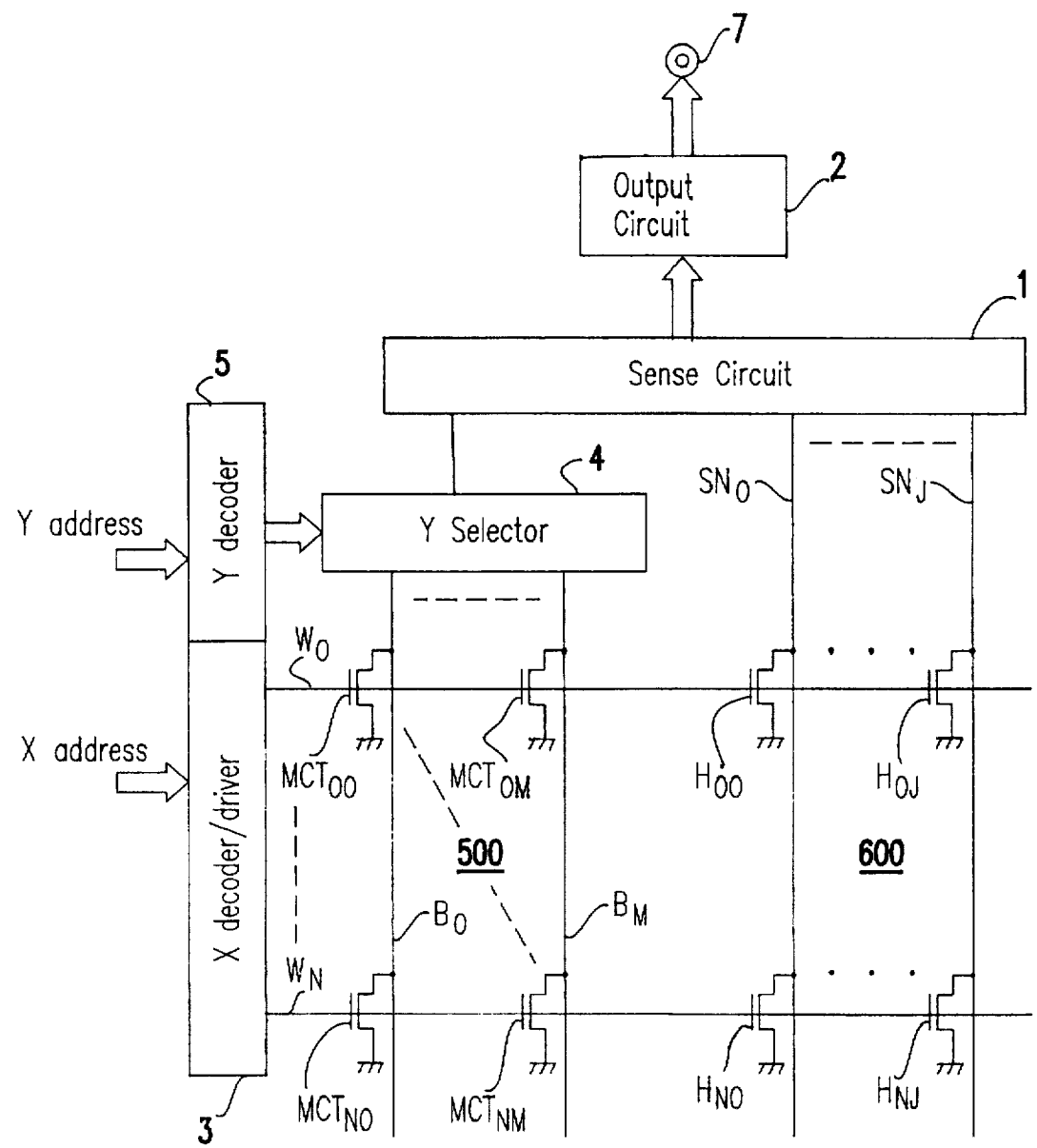
FIG. 1 is a block diagram of a part of the memory according to a first embodiment of the invention.

FIG. 1 is a block diagram of the memory according to a first embodiment. This memory comprises N word lines $W_0$–$W_N$, M bit lines $B_0$–$B_M$, and a cell array 500 including memory transistors $MCT_{00}$–$MCT_{NM}$ arranged at every intersection of the word and bit lines. In addition, an array 600 of comparison transistors is provided according to this invention, where the array 600 comprises comparison transistors $H_{00}$–$H_{NJ}$ of N rows and J columns. Here, J is the number equal to the number of thresholds that can be set for each memory transistor minus one. For example, if 4 thresholds can be set for each memory transistor MCT, then J is equal to 3. One of the word lines W is selected by an X decoder/driver 3 in response to an X address. Similarly, one of the bit lines B is selected by a Y decoder 5 and a Y selector 4 in response to a Y address.

In the array 600 of comparison transistors, the gates of the comparison transistors arranged in the same row are connected to the corresponding word line, and the drains of the comparison transistors arranged in the same column are connected to the corresponding line of the sense lines $SN_0$–$SN_J$. Each of the sense lines SN is connected to a sensing circuit 1. The bit line selected by the Y selector is also connected to the sensing circuit 1. The sensing circuit 1 generates a piece of multibit information to be stored in a selected memory cell based on the magnitude of the currents flowing in the bit line and the sense lines, and outputs it to an output circuit 2. The output circuit 2 is formed of tristate buffers or the like, and drives an output terminal 7 based on the data from the sensing circuit 1. Although there are plurality of output terminals 7 in reality, only one of them is shown in this figure.

Figure 2A:
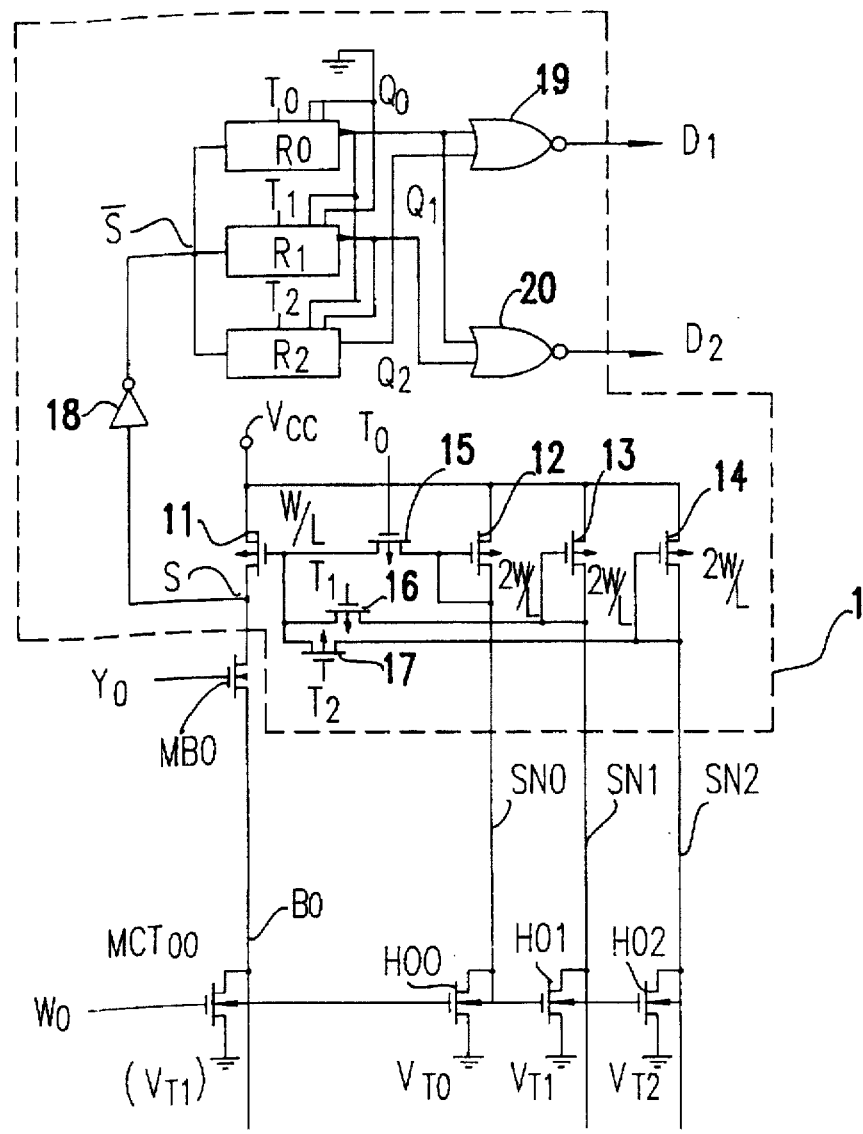
FIG. 2(a) is a circuit diagram of a part of the memory according to the first embodiment of the invention.
Figure 2B:
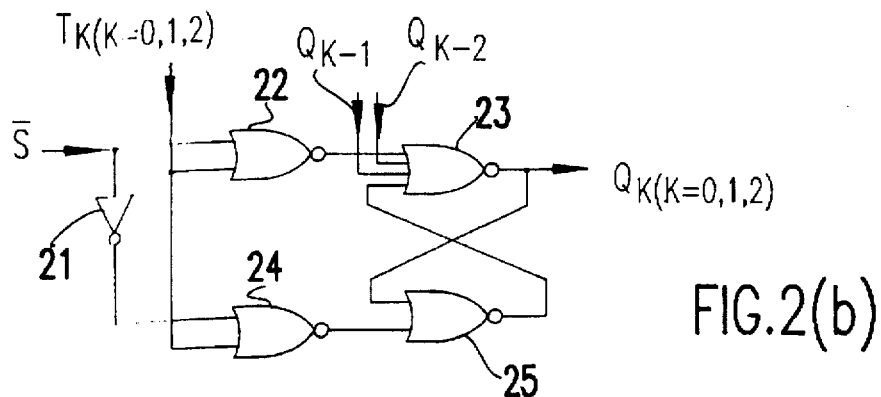
FIG. 2(b) is a circuit diagram of a part shown in FIG. 2(a)

A sensing circuit 1 according to this embodiment is shown in FIG. 2(a). There are also shown one word line $W_0$, one memory transistor $MCT_{00}$, and a selection transistor $MB_0$ in the Y selector 4. Besides, since it is arranged that one out of four thresholds is set for each memory cell transistor, three comparison transistors $H_{00}$, $H_{01}$, and $H_{02}$ are provided for the word line $W_0$. The sensing circuit 1 is constituted of P-channel transistors 11, 12, 13, 14, 15, 16, and 17, an inverter 18, a power terminal $V_{CC}$, three blocking circuits $R_0$, $R_1$, and $R_2$, and two NOR circuits 19 and 20. Each of the blocking circuits $R_0$–$R_2$ is constituted as shown in FIG. 2(b). The channel width of the transistors 12, 13, and 14 is given twice as large value as the channel width W of the transistor 11. For the purpose intended, the reduction of the channel length of the transistors 12, 13, and 14 to half of the channel length of the transistor 11 will also do.

Figure 3:
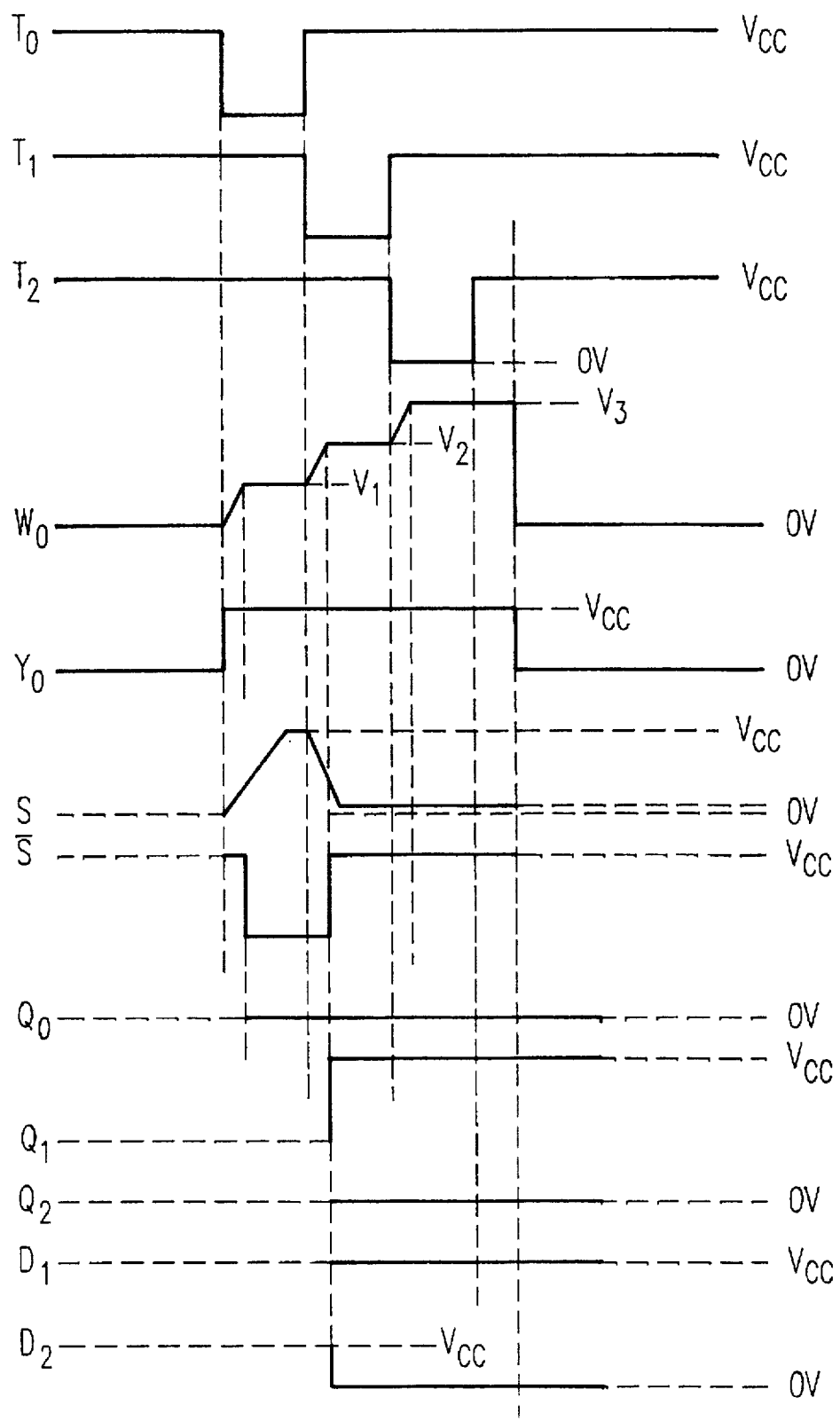
FIG. 3 is a timing chart for a part of the memory in the first embodiment of the invention.

Referring to the timing chart in FIG. 3, the operation of this memory will be described. Here, it will be assumed that the memory transistor $MCT_{00}$ is selected by the X and Y addresses, and that the threshold of this transistor is set to the second threshold $V_{T1}$ of the four thresholds $V_{T0}$, $V_{T1}$, $V_{T2}$, and $V_{T3}$. Further, the thresholds of the comparison transistors $H_{00}$, $H_{01}$, and $H_{02}$ are $V_{T0}$, $V_{T1}$, and $V_{T2}$, respectively.

The word line $W_0$ is first driven to a level $V_1$ intermediate between the thresholds $V_{T0}$ and $V_{T1}$. At this time, a timing signal generating circuit which is not shown in the FIG. 2 sets only the timing signal $T_0$ to L to energize the transistor 15. Therefore, a current mirror circuit is formed which has the transistors 12 and 11 as the input side and the output side transistors, respectively. The memory transistor $MCT_{00}$ stays turned off even when the level of the word line $W_0$ is $V_1$ since it has the threshold $V_{T1}$. On the other hand, the comparison transistor $H_{00}$ is energized and a current $I_0$ flows in it. Here, a current mirror circuit is formed by the transistors 12 and 11 as mentioned above, and a current which is half of $I_0$ is expected to flow in the transistor 11 since the channel width of the transistor 11 is half of the channel width of the transistor 12. Since, however, the memory cell transistor $MCT_{00}$ is in the off-state, no current will flow in the bit line $B_0$. Therefore, the level at output node S of $B_0$ is pulled up to $V_{CC}$, and an inverter 18 outputs a L level. As a result, the latch block $R_0$ receives signals $(\overline{S}, T_0, Q_{-1}, Q_{-2})$=(L,L,L,L), and it outputs $Q_0$=L.

Following that, the word line $W_0$ is driven to a level $V_2$ which is intermediate between the thresholds $V_{T1}$ and $V_{T2}$. In addition, the timing signals $T_0$, $T_1$, and $T_2$ go to H, L, and H, respectively. The memory transistor $MCT_{00}$ is thus energized and lets a current $I_1$ flow in it. On the other hand, the comparison transistor $H_{01}$ is energized to pass a current $I_1$, and the sense current flows also in the P-channel transistor 13. A current mirror circuit is formed by the P-channel transistors 13 and 11 at the period that the timing signal $T_1$ is L, but the transistor 11 has only the capacity of passing a current which is half of $I_1$ since the gate width of the transistor 11 is half of that of the transistor 13. As a result, the point S goes to L, and $\overline{S}$ node goes to H. At this time, the output of the latch block $R_0$ stays at L. On the other hand, the latch block $R_1$ receives the signals $(\overline{S}, T_1, Q_0, Q_{-1})$=(H, L,L,L), and its output Q1 goes to H. Since the latch block $R_2$ receives the signals $(\overline{S}, T_2, Q_1, Q_0)$=(H,H,L,H), its output $Q_2$ goes to L.

The word line $W_0$ is further driven to a level $V_3$ which is intermediate between the thresholds $V_{T2}$ and $V_{T3}$, and the timing signals $T_0$, $T_1$, and $T_2$ go to H, H, and L, respectively. In this case, the output node S is at L and the node $\overline{S}$ is at H analogous to the case when the level of the word line $W_0$ is $V_2$. No change occurs in the outputs of the respective latch blocks $R_0$ and $R_1$, and the output Q2 of the latch block $R_2$ also stays at L.

Following this, the levels of the timing signals $T_0$, $T_1$, and $T_2$ all go to H, while the voltage level of the word line $W_0$ remains at $V_3$. Because of this, the transistors 12–14 are cut off from the transistor 11, but the gate of the transistor 11 holds the previous biased potential. Therefore, the output node S stays at L, and the node $\overline{S}$ remains at H. As a result, the outputs of the latch blocks $R_0$–$R_2$ undergo no change.

In this way, the NOR gates 19 and 20 output (1,0) as the 2-bit data stored in the memory transistor $MCT_{00}$.

Thereafter, the word line $W_0$ is reset to the ground level, completing the sense or read operation of the data.

When the threshold of the memory transistor MCT is $V_{T0}$ or $V_{T2}$, if the driving level of the word line W is $W_1$ or $W_3$, H appears at the output node S. When the threshold of the memory transistor MCT is $V_{T3}$, the output node S stays at L regardless of the driving level of the word line. These states are fetched as they are by the latch blocks $R_0$–$R_2$, and a 2-bit output data corresponding to the set thresholds is obtained. In FIG. 4 are shown the relations among the threshold of the memory transistor, the driving voltage of the word line, on/off of each transistor, and the value of the output data. From the table it can be seen that when the thresholds of the memory transistors are $V_{T0}$, $V_{T1}$, $V_{T2}$, and $V_{T3}$, the output data are (0,0), (1,0), (0,1), and (1,1), respectively.

In such a sensing system, the current sensing system using a current mirror circuit is employed as mentioned above, so that the change of the output node S to H or L is carried out at a remarkably high speed, and yet the configuration involved is very much simplified.

Figure 5:
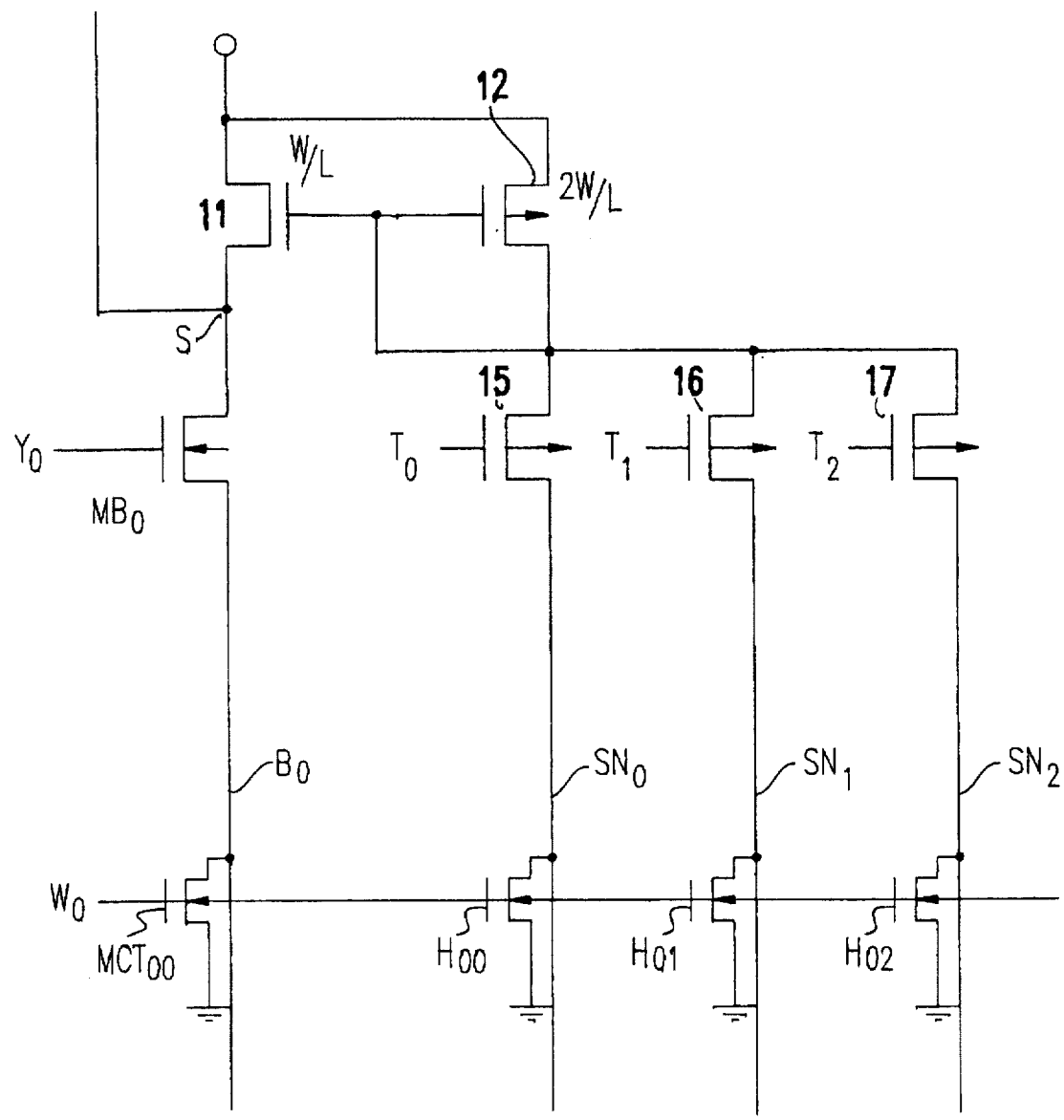
FIG. 5 is a circuit diagram of a part of the memory according to a second embodiment of the invention.

In FIG. 5 is shown a circuit diagram of the memory according to a second embodiment of the invention. In this embodiment, transistors 15–17 which receive the timing signals $T_0$–$T_2$, respectively, are provided between the comparison transistors $H_{00}$–$H_{02}$ and the input side transistors 12–14 of the current mirror circuits. Since the operation of this circuit is substantially identical to that of the circuit and the timing chart shown in FIG. 2 and FIG. 3, further description will be omitted.

Figure 6:
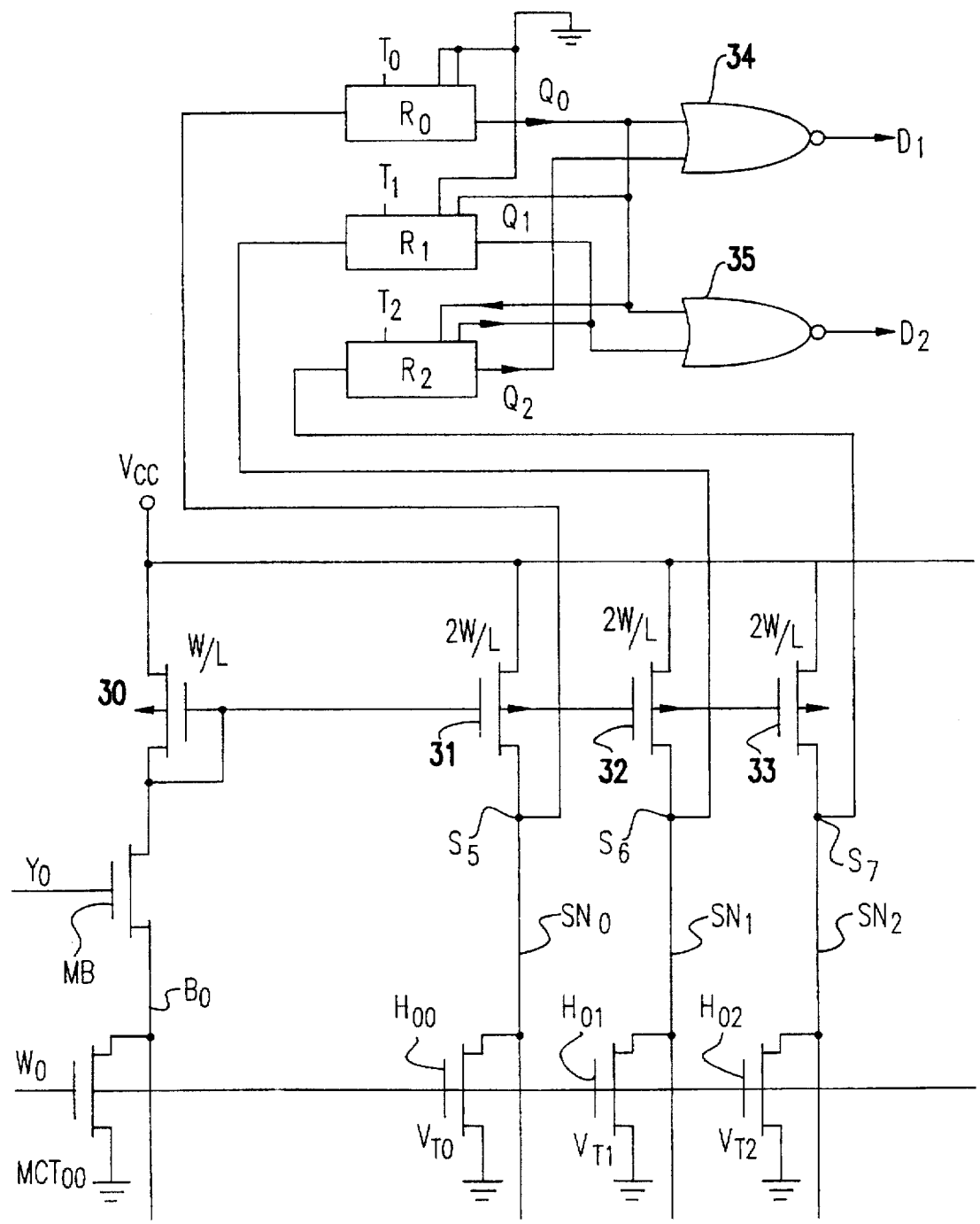
FIG. 6 is a circuit diagram of a part of the memory according to a third embodiment of the invention.

FIG. 6 is a circuit diagram of the memory according to a third embodiment of the invention. This memory adopts a reading system in which the level of the word line is raised in steps, analogous to the first and the second embodiments. However, in this embodiment, the current mirror circuits formed by transistors 30–33 use the transistors on the cell side as the input side transistors and the comparison transistors as the transistors on the output side. Further, the sense lines are connected to the latch block circuits as respective output nodes. The channel width of the transistors 31, 32, and 33 is twice as large the channel width of the transistor 30.

The operation of this memory will be described assuming that the threshold of the transistor $MCT_{00}$ is set to $V_1$. When the word line $W_0$ is driven to $V_1$ and the timing signals $T_0$, $T_1$, and $T_2$ go to L, H, and H, respectively, the comparison transistor $H_{00}$ is energized, and the memory transistor $MCT_{00}$ and the comparison transistors $H_{01}$ and $H_{02}$ are deenergized. Since the memory transistor $MCT_{00}$ is turned off, the transistors 30, 31, 32, and 33 stay turned off. Therefore, the level of the output node $S_5$ goes to L. The latch block $R_0$ receives the signals $(S_5, T_0, Q_{-1}, Q_{-2})$=(L, L,L,L), and outputs $Q_0$=L.

When the word line $W_0$ is driven to $V_2$ and the signals $T_0$, $T_1$, and $T_2$ go to H, L, and H, respectively, the memory transistor $MCT_{00}$ is energized, and the comparison transistors $H_{00}$ and $H_{01}$ are also energized. Due to the energization of the memory transistor $MCT_{00}$ a current $I_0$ flows in the transistor 30. Because of the channel width setting for the transistors 30–33 mentioned above, a current twice as large as the current $I_0$ is expected to flow in the transistors 31, 32 and 33. On the other hand, only a current equal to $I_0$ flows in the comparison transistor $H_{01}$. Therefore, the level of output node $S_6$ rise to H, and it is transmitted to the latch block $R_1$. Since the latch block $R_0$ receives the signals $(S_5, T_0, Q_{-1}, Q_{-2})$=(indefinite, H,L,L), it holds the previous output state ($Q_0$=L), and since the latch block $R_1$ receives the signals $(S_6, T_1, Q_0, Q_{-1})$=(H,L,L,L), it outputs $Q_1$=H. Moreover, since $R_2$ receives the signals $(S_7, T_2, Q_1, Q_0)$=(H,H,H,L), it outputs $Q_2$=L.

When the word line $W_0$ is further driven to a voltage level $V_3$ and the signals $T_0$, $T_1$, and $T_2$ go to H,H, and L, respectively, the memory transistor $MCT_{00}$ and all of the comparison transistors $H_{00}$, $H_{01}$, and $H_{02}$ are energized. As a result, the levels of the output nodes $S_6$ and $S_7$ go to H. Therefore, the latch block $R_0$ receives the signals $(S_5, T_0, Q_{-1}, Q_{-2})$=(indefinite, H,L,L), and holds $Q_0$=L as it has been $Q_0$=L. On the other hand, $R_1$ receives the signals $(S_6, T_1, Q_0, Q_{-1})$=(H,H,L,L), and holds $Q_1$=H as it has been $Q_1$=H. Further, $R_2$ receives the signals $(S_7, T_2, Q_1, Q_0)$=(H,L,H,L), and outputs $Q_2$=L.

In the state where the level of the word line $W_0$ is at $V_3$, if the signals $T_0$, $T_1$, and $T_2$ are all at H, and as a result, the transistors hold their respective previous states.

Figure 7:
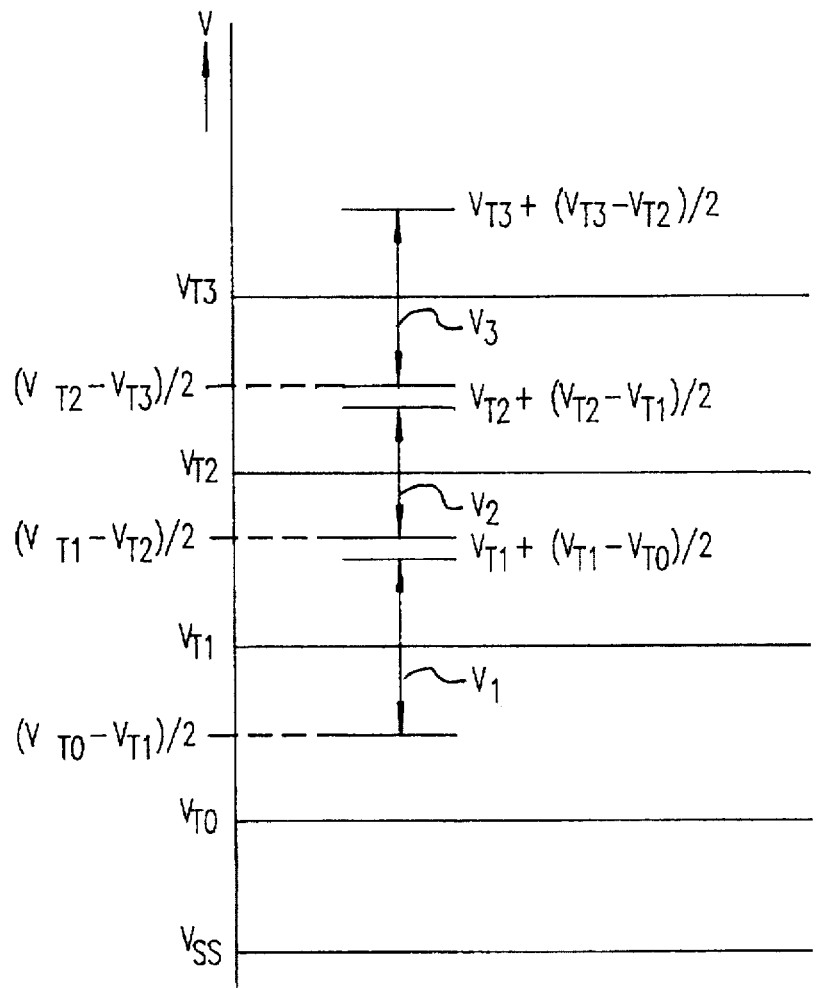
FIG. 7 is a diagram showing the relation between the thresholds and the word line driving levels according to the invention.

In this way, $(D_1, D_2)$=(1,0) is obtained also in this embodiment as the stored data in the memory cell transistor $MCT_{00}$. Moreover, it is not necessary in this embodiment to restrict the thresholds $V_{T0}$, $V_{T1}$, $V_{T2}$, and $V_{T3}$ of the memory transistor and the comparison transistors and the levels $V_1$, $V_2$, and $V_3$ of the word line $W_0$ to the relation $V_{T0}<V_1<V_{T1}<V_2<V_{T2}<V_3<V_{T3}$, and, as shown in FIG. 7, it is possible to give margins to the driving levels $V_1$, $V_2$, and $V_3$ of the word line $W_0$. Namely, in this memory circuit, current mirror circuits are formed using the memory transistor and the comparison transistors, and the channel width of the current mirror transistor provided on the bit line of the memory transistor and the channel width of the current mirror transistors provided on the sense lines of the comparison transistors are set to different values, so that the memory is so constituted as to output the energization state of the memory transistor as a high level or a low level signal by sensing the difference between the currents of conduction in the comparison transistors and the memory transistor. Therefore, even if the potential of the word line is $V_1$ which is higher than $V_{T0}$ and $V_{T1}$, the sensing circuit can output a signal of sufficiently high level because the current (for example, 1 μA) that flows in the memory transistor is much smaller than the current (for example, 10 μA) that flows in the comparison transistors.

To be more specific, assume that the present memory is formed so as to have an equal difference between the consecutive thresholds:

$$V_{T3}-V_{T2}=V_{T2}-V_{T1}=V_{T1}-V_{T0}.$$

If $I_0$ is the current that flows in a comparison transistor with threshold $V_{T0}$ and $I_1$ is the current that flows in the memory transistor with threshold $V_{T1}$, one has $$I_0=K(V_1-V_{T0}),$$

$$I_1=K(V_1-V_{T1}), \text{ (for } V_1>V_{T1}\text{)},$$

$$I_1=0 \text{ (for } V_1 \leq V_{T1}\text{)},$$

where K is an arbitrary constant. Therefore, even if the value of $V_1$ is set to be equal to $(V_{T2}+V_{T1})/2$, it follows from the above equations that $$I_1 = I_0 * (V_1 - V_{T1})/(V_1 - V_{T0}) = \frac{V_{T1} - V_{T0}}{3(V_{T1} - V_{T0})} \quad I_0 = I_0 \times \frac{1}{3}$$

From the above equation it can be seen that the current $I_1$ that flows in the memory transistor is only ⅓ of the current $I_0$ that flows in the comparison transistor. Therefore, even when the potential of $V_1$ becomes equal to $(V_{T2}+V_{T1})/2$, it is only necessary to set the inverter 18 or the blocking circuit so as to enable the recognition of the high level even for the current ratio of 1 to 3. This means that the present invention has the effect of facilitating the design and the manufacture of this memory.

Figure 8:
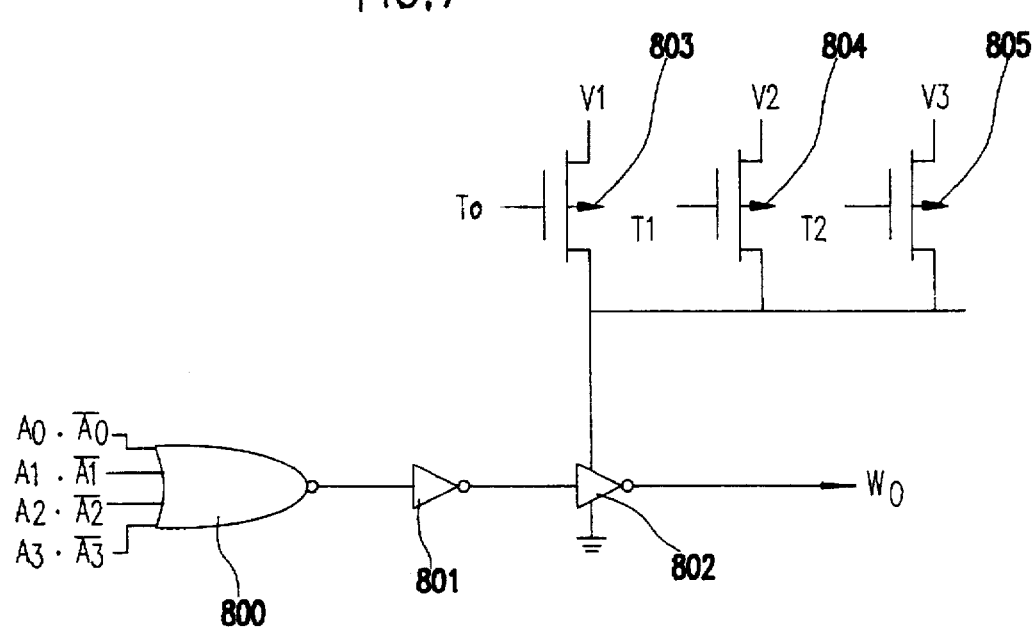
FIG. 8 is a word line potential generating circuit for the first, second, and third embodiments of the invention.

In FIG. 8 is shown a part of the X decoder/driver that can be used in the embodiments described so far. This circuit includes a NOR circuit 800 which outputs a high level by the combination of the addresses, and two stages of inverters 801 and 802. The operating voltage of the second stage inverter 802 is switched to one of the voltages $V_1$, $V_2$, and $V_3$ by means of the timing signals $T_0$, $T_1$, and $T_2$ and transistors 803–805. The level of a word line thus selected is driven stepwise in synchronism with the timing signals.

Figure 9:
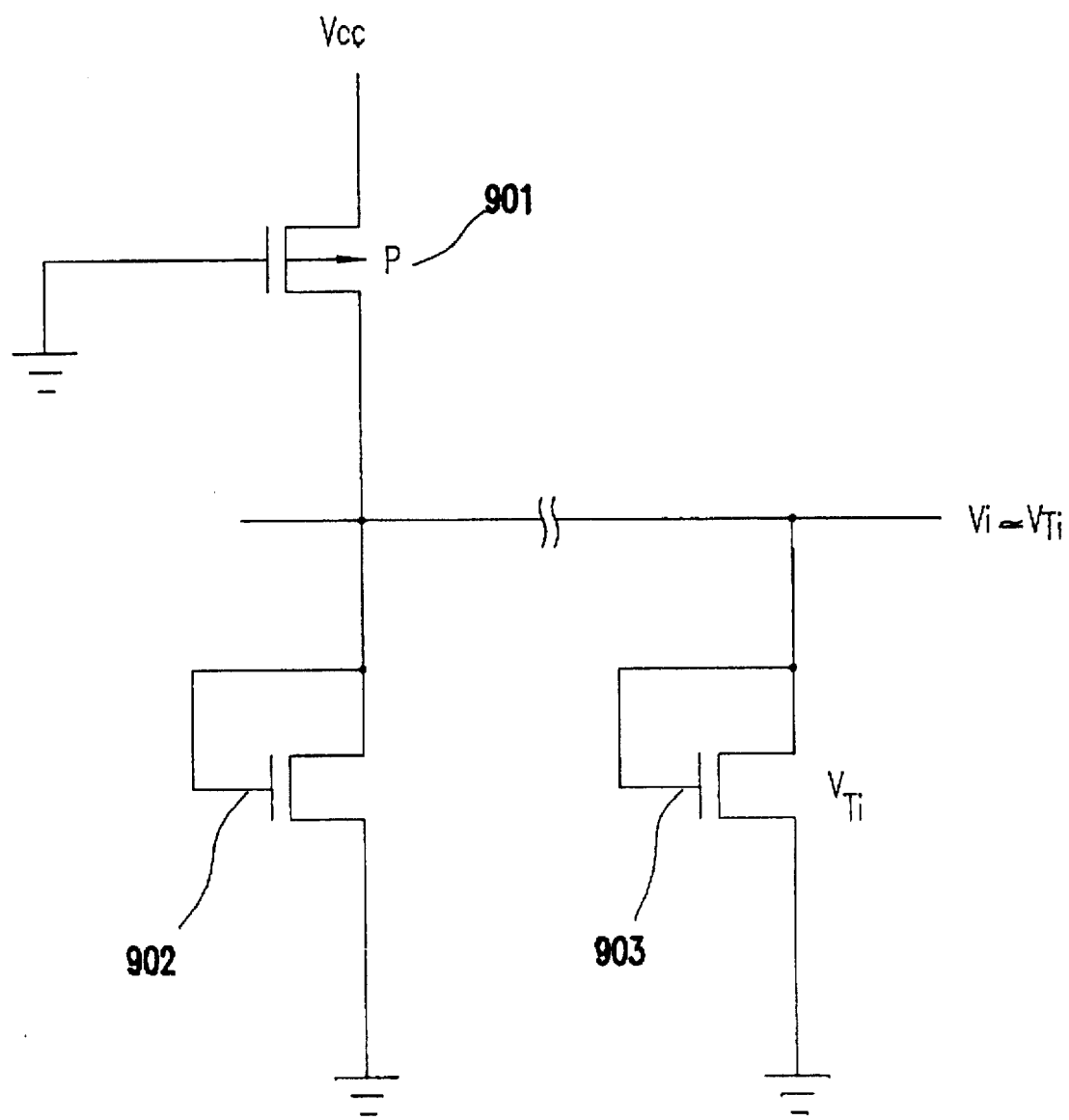
FIG. 9 is a voltage generating circuit for the first, second, and third embodiments of the invention.

Each of the driving levels can be generated by, for example, a configuration as shown in FIG. 9. This circuit includes a PMOS transistor 901 with its drain connected to the power supply voltage and its gate connected to the ground, and groups 902 and 903 of NMOS transistors formed by connecting 10–100 pieces of NMOS transistors, the source of each is grounded and the gate and the drain of each are connected to the source of the transistor 901, and an output voltage $V_i$ is taken out from the source of the transistor 901. The NMOS transistor is a cell transistor having a threshold $V_{Ti}$, and outputs a voltage $V_i$ which is approximately equal to $V_{Ti}$. If the current driving power of one NMOS transistor is 1 μA, for example, the parallel connection of 50 of them produces a current driving power of 50 μA, so the use of a plurality of NMOS transistors produces a current with high driving capacity. Accordingly, it has an effect of drastically reducing the delay time.

Although the system of driving the word line from a low potential to a high potential has been employed in each of the embodiment described in the above, information in the memory transistor may be read out by driving the word line from a high potential to a low potential.

Figure 10A:
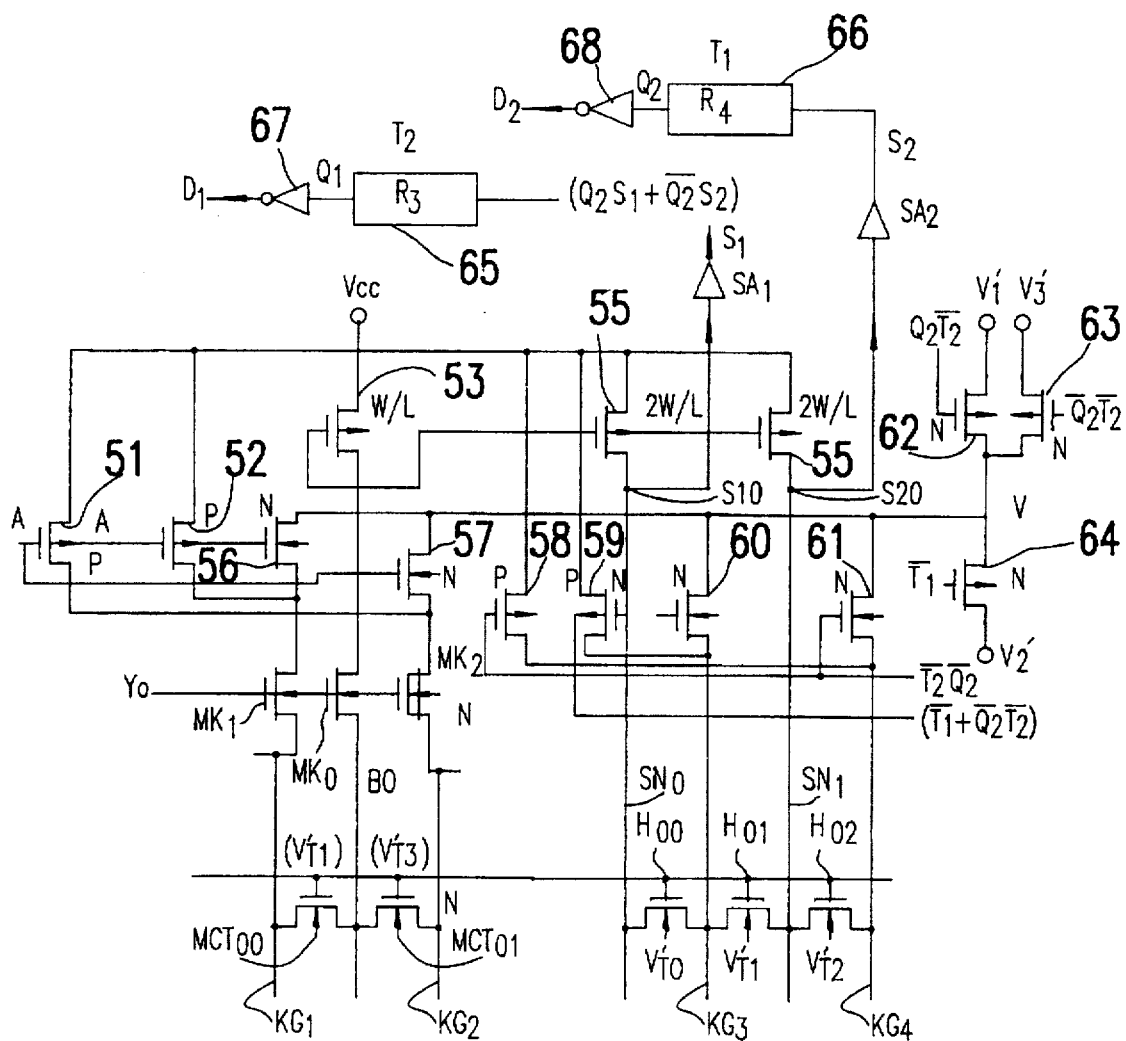
FIG. 10(a) is a circuit diagram of a part of the memory according to a fourth embodiment of the invention.
Figure 10B:
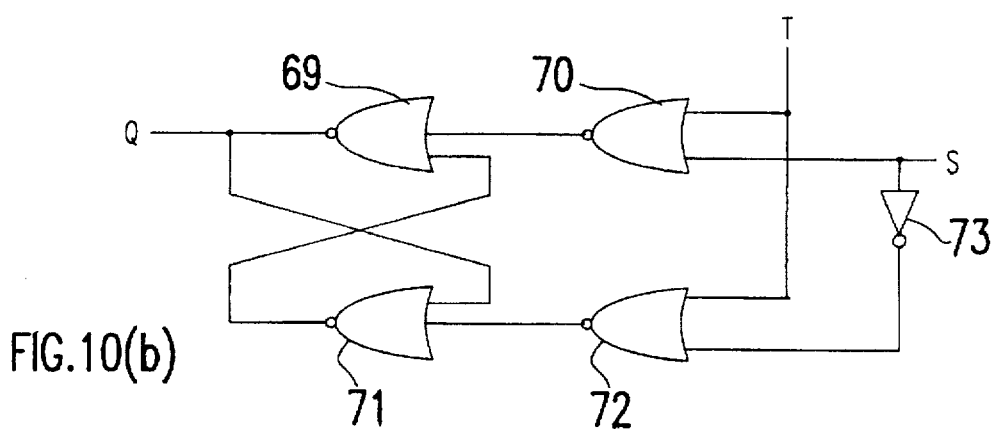
FIG. 10(b) is a circuit diagram of a part shown in FIG. 10(a)

In FIG. 10 which shows the semiconductor memory according to a fourth embodiment of this invention, FIG. 10(a) is a block diagram showing a part of the memory, and FIG. 10(b) is a circuit diagram of the latch block in FIG. 10(a).

This embodiment adopts, instead of the method of driving the potential of the word line, a method of using ground lines made of metallic wirings and driving them as virtual ground lines, as the method of detecting the threshold of the memory transistor.

The word line $W_0$ is connected respectively to the gates of the memory transistors $MCT_{00}$ and $MCT_{01}$, and the comparison transistors $H_{00}$, $H_{01}$, and $H_{02}$. One of the source and the drain of the memory transistor $MCT_{00}$ is connected to the bit line $B_0$, and the other is connected to a virtual ground line KG1. On the other hand, one of the source and the drain of the memory transistor $MCT_{01}$ is connected to the bit line $B_0$, and the other is connected to a virtual ground line KG2. One of the source and the drain of the comparison transistors $H_{00}$ and $H_{01}$ is connected commonly to a virtual ground line KG3, and the other is connected individually to a sense line $SN_0$ and a sense line $SN_1$. One of the source and the drain of the comparison transistor $H_{02}$ is connected to the sense line $SN_1$, and the other is connected to a virtual ground line KG4. The source and the drain of each transistor are formed of a common diffused layer. Each of the virtual ground lines is formed of a metallic wiring consisting of an aluminum wiring. The virtual ground lines KG1 and KG2 are selected by switching the address. The virtual ground line (for example, KG1) connected to a memory to be read out is connected to a node V, and another virtual ground line (for example, KG2) is connected to $V_{CC}$. The virtual ground lines KG3 and KG4 are also respectively controlled by the potential of the node V or $V_{CC}$. The bit line $B_0$, and the sense lines $SN_0$ and $SN_1$ respectively form current mirrors. The sense lines $SN_0$ and $SN_1$ are connected to sense amplifiers SA1 and SA2, respectively. The blocking circuit $R_3$ receives $Q_2S_1+\bar{Q}_2S_2$ and $T_2$, and outputs $D_1$ via an inverter 67. The blocking circuit $R_4$ receives $S_2$ and $T_1$, and outputs $D_2$ via an inverter 68.

Figure 11:
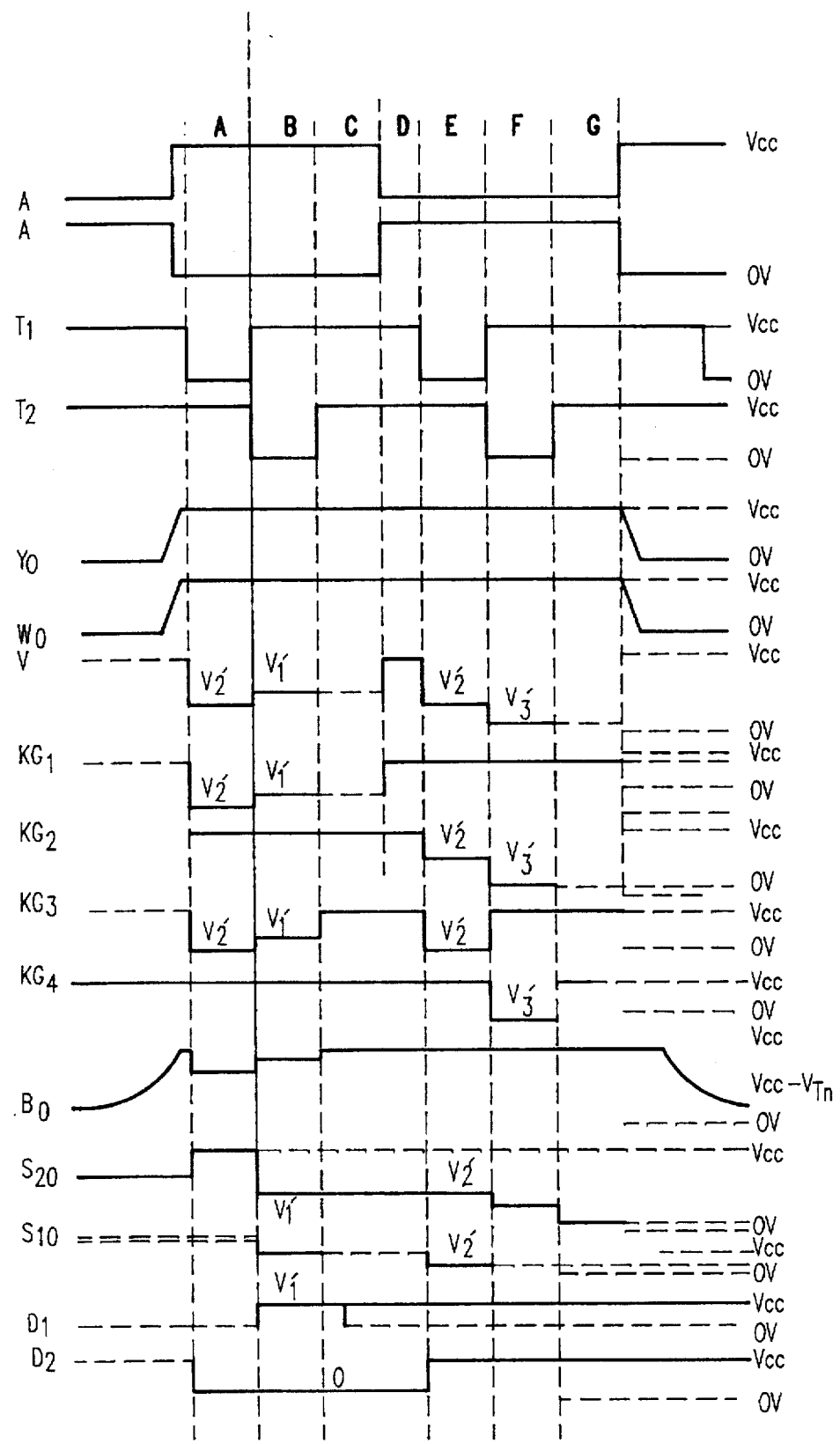
FIG. 11 is a timing chart for a part of the memory in the fourth embodiment.
Figure 12:
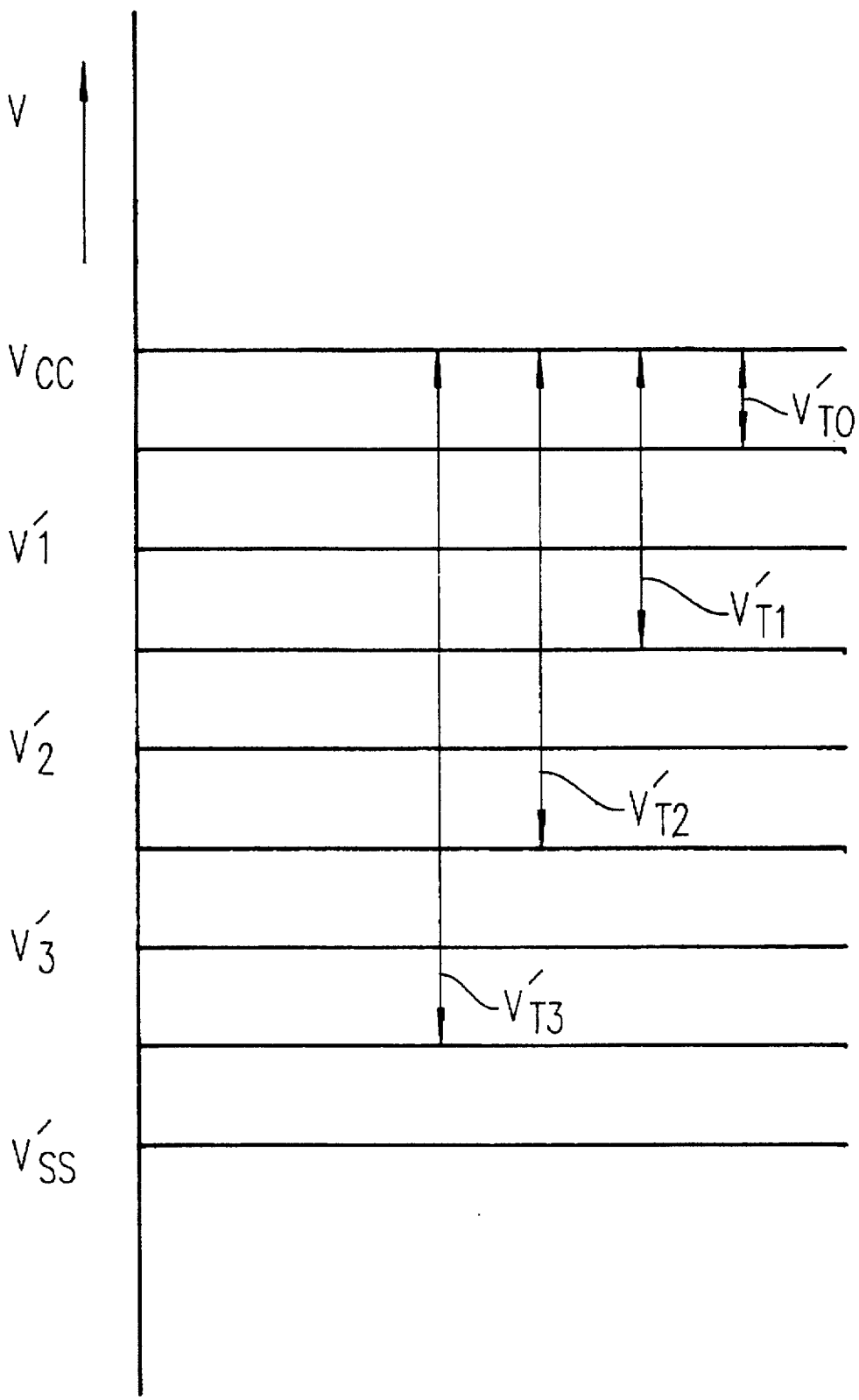
FIG. 12 is a diagram showing the relation between the thresholds and the virtual ground line driving levels of the fourth embodiment.

Next, referring to the timing chart in FIG. 11, the operation of the memory in FIG. 10 will be described. For the sake of description, it will be assumed that the thresholds of the memory transistors $MCT_{00}$ and $MCT_{01}$ are $V'_{T1}$ and $V'_{T3}$, respectively, and the thresholds of the comparison transistors $H_{00}$, $H_{01}$, and $H_{02}$ are $V'_{T0}$, $V'_{T1}$, and $V'_{T2}$, respectively. The relations among the levels $V_{SS}$, $V_1'$, $V_2'$, $V_3'$, and $V_{CC}$ of the virtual ground lines will be assumed to be $V_{SS}<V_3'<V_2'<V_1'<V_{CC}$ (see FIG. 12). In the following, a method will be described in which the level of the virtual ground line is once raised to $V_2'$, then raise or lower the level of the virtual ground line depending upon the state of the memory transistor.

First, as the initial condition, both timing signals $T_1$ and $T_2$ are set at H. Then, since the transistors 62, 63, and 64 are all deenergized, their common source potential V is at a floating level. However, the potential V is substantially equal to $V_{CC}-V_{Tn}$ ($V_{Tn}$ is the threshold of the peripheral N-channel transistor) since the virtual ground line KG1 is charged during the previous state where address signal A is at H. In addition, the memory transistors and the comparison transistors are turned on in advance by setting the word line $W_0$ and the selector signal $Y_0$ to H. Because of this, the virtual ground line KG1 is connected to the node V and is at a floating level. Moreover, since a transistor 51 is turned on and a transistor 57 is turned off due to the L level of $\overline{A}$, the virtual ground line KG2 is precharged to a value close to $V_{CC}-V_{Tn}$. Further, the bit line $B_0$ is also raised to near $V_{CC}-V_{Tn}$. Therefore, no current will flow in the memory transistor $MCT_{01}$. Further, since the virtual ground line KG4 is at the level of $V_{CC}-V_{Tn}$, the comparison transistor $H_{02}$ is turned off.

After the initialization, the timing signals $T_1$ and $T_2$ are set to L and H, respectively. Then, the transistor 64 is turned on and the potential of the node V drops to $V_2'$. In addition, the potential of the virtual ground line KG3 drops also to $V_2'$, since transistor 60 is also turned on. Moreover, the potential of KG1 drops also to $V_2'$. Therefore, a certain current $I_1$ flows in the memory transistor $MCT_{00}$, and the current $I_1$ also flows in a P-channel transistor 53. A current twice as large as the current $I_1$ is expected to flow in a P-channel transistor 55 because of its width being twice that of the transistor 53. However, due to the fact that the channel width of the comparison transistor $H_{01}$ with threshold $V'_{T1}$ has a channel width the same as that of the memory transistor $MCT_{00}$, only a current $I_1$ flows in the transistor 55. Because of this the level of the output $S_{20}$ goes up and the output $S_2$ of the sense amplifier SA2 reaches the $V_{CC}$ level. Since $T_2$ is H level, the data output $D_1$ of the blocking circuit $R_3$ does not change. In the blocking circuit $R_4$ the H of $S_2$ is latched by the timing signal $T_1$, and H is output Its data output $D_2$ is L, and "0" is output as the data. It is detected during this period that the threshold of the memory transistor $MCT_{00}$ is $V'_{T0}$ or $V'_{T1}$. (Period Ⓐ)

Next, the operation of detecting whether the threshold of the memory transistor $MCT_{00}$ is $V'_{T0}$ or $T'_{T1}$ is started. When the timing signals $T_1$ and $T_2$ go to H and L, respectively, the transistor 62 is turned on and the transistors 63 and 64 are turned off because $Q_2$ is H in the operation during Period Ⓐ. Accordingly, the potential of the node V is raised to $V_1'$. Then, the virtual ground lines KG1 and KG3 go to $V_1'$ and the memory transistor $MCT_{00}$ is deenergized. Since no current flows in the bit line $B_0$, the transistors 53, 54, and 55 are turned off. Since the virtual ground line KG3 is at potential $V_1'$, the comparison transistor $H_{00}$ is energized and the potential of the sense line $SN_0$ drops to near $V_1'$. Because of this, the sense amplifier SA1 outputs L. The blocking circuit $R_3$ latches L with the timing signal $T_2$ because of $(Q_2, S_1)=(H,L)$. As a result, the output $D_1$ is H, and gives a data "1". The blocking circuit $R_4$ is at L holding the level of $Q_2$ during Period Ⓐ regardless of the level of $S_2$ due to the H of the timing signal $T_1$, and outputs a data "0". (Period Ⓑ)

When both timing signals $T_1$ and $T_2$ go to H, the transistors 62, 63, and 64 are respectively turned off, and the node V goes to a floating level. Both the virtual ground lines KG1 and KG3 go to floating levels, and the outputs of $S_1$ and $S_2$ are indefinite. Since the blocking circuits $R_3$ and $R_4$ receive the timing signals $T_1$ and $T_2$ at H, respectively, they hold the outputs $Q_1$ and $Q_2$ of Period Ⓑ. (Period Ⓒ)

When the signal $\overline{A}$ goes to H, the transistor 51 is turned off and the transistor 57 is turned on, and the virtual ground line KG2 is connected to the node V. The node V is not connected to the power supplies $V_1$, $V_2$, and $V_3$ because the timing signal $T_2$ is at H, but is connected to the virtual ground line KG2 at the level $V_{CC}-V_{Tn}$ as mentioned above, so its potential is raised to $V_{CC}-V_{Tn}$. Moreover, the memory transistor $MCT_{01}$ is selected due to the connection of the virtual ground line KG2 to the node V. Since the address signal A is at L and hence the transistor 52 is turned on and the transistor 56 is turned off, the virtual ground line KG1 goes to the level of $V_{CC}-V_{Tn}$. The data outputs $D_1$ and $D_2$ are held. (Period Ⓓ)

When $T_1$ goes to L and $T_2$ goes to H, only the transistor 64 is turned on and the potential of the node V goes to $V_2'$. Accordingly, the potential of the virtual ground line KG2 also goes to $V_2'$. The memory transistor $MCT_{01}$ is deenergized because of its threshold being $V'_{T3}$, and no current flows in the transistor 53. Thus, the transistors 54 and 55 are turned off. Because of this, the sense lines $SN_0$ and $SN_1$ become equipotential with the virtual ground line KG3 with potential $V_2'$. Therefore, both $S_1$ and $S_2$ go to the L level. The blocking circuit $R_3$ outputs $Q_1$ at L because of the timing signal $T_2$. The blocking circuit $R_4$ latches the L of $S_2$ with the L level of the timing signal $T_1$, and outputs $Q_2$ of L level. (Period Ⓔ)

During the periods up to the preceding one it is discriminated that the threshold of the memory transistor $MCT_{01}$ is either one of $V'_{T2}$ and $V'_{T3}$. In this period it will be discriminated which of the two is actually the threshold of the memory transistor. Since the timing signal $T_1$ is at H, and $T_2$ is at L, and $Q_2$ is found to be at L in Period Ⓔ, the transistors 62 and 64 are turned off and 63 is turned on, and the potential of the node V goes to $V_3'$. The virtual ground line KG2 goes to potential $V_3'$, but the memory transistor $MCT_{01}$ is deenergized since its threshold may be $V'_{T3}$ and hence the transistors 53, 54, and 55 remain turned off. Since the potential of the virtual ground line KG4 is $V_3'$, the comparison transistor $H_{02}$ is turned on and a current flows from the sense line $SN_1$ to the virtual ground line KG4. The node $S_{20}$ is drawn by the potential $V_3'$, and the sense amplifier SA2 outputs L. Because of the input of the timing signal $T_1$, the blocking circuit $R_4$ outputs $Q_2$ at L, and data $D_2$ which is "1". Since $Q_2$ is at L and $S_2$ is at L, the blocking circuit $R_3$ latches L and outputs data "1". (Period Ⓕ)

Since both timing signals $T_1$ and $T_2$ go to H, and the node V goes to a floating level, the virtual ground line KG2 also goes to the floating level. The remaining virtual ground lines all go to the potential $V_{CC}-V_{Tn}$. In addition, the timing signals $T_1$ and $T_2$ that are both at H are input to respective blocking circuits so that the levels in the Period F are held as they are. (Period Ⓖ)

From the operations in the above it can be detected that the thresholds of the memory transistors $MCT_{00}$ and $MCT_{01}$ are $V'_{T1}$ and $V'_{T3}$. When the thresholds of the memory transistors are $V'_{T0}$, $V'_{T1}$, $V'_{T2}$, and $V'_{T3}$, (0,0), (1,0), (0,1) and (1,1), respectively, are output by the operation similar to the above.

With the above constitution in which the virtual ground lines (and the digit lines) are formed of aluminum wirings with small sheet resistivity, the delay time can be reduced as compared to the case of driving the word lines consisting of polysilicon wirings (the resistivity is, for example, 10 Ω/square even when the gate is formed of polysilicon and tungsten layers). It is possible to enhance the capacity by increasing the space factor since there is no need for increasing the number of X decoders which is required by the shortening of the length of the word lines is consideration of the delay in the word lines.

Figure 13A:
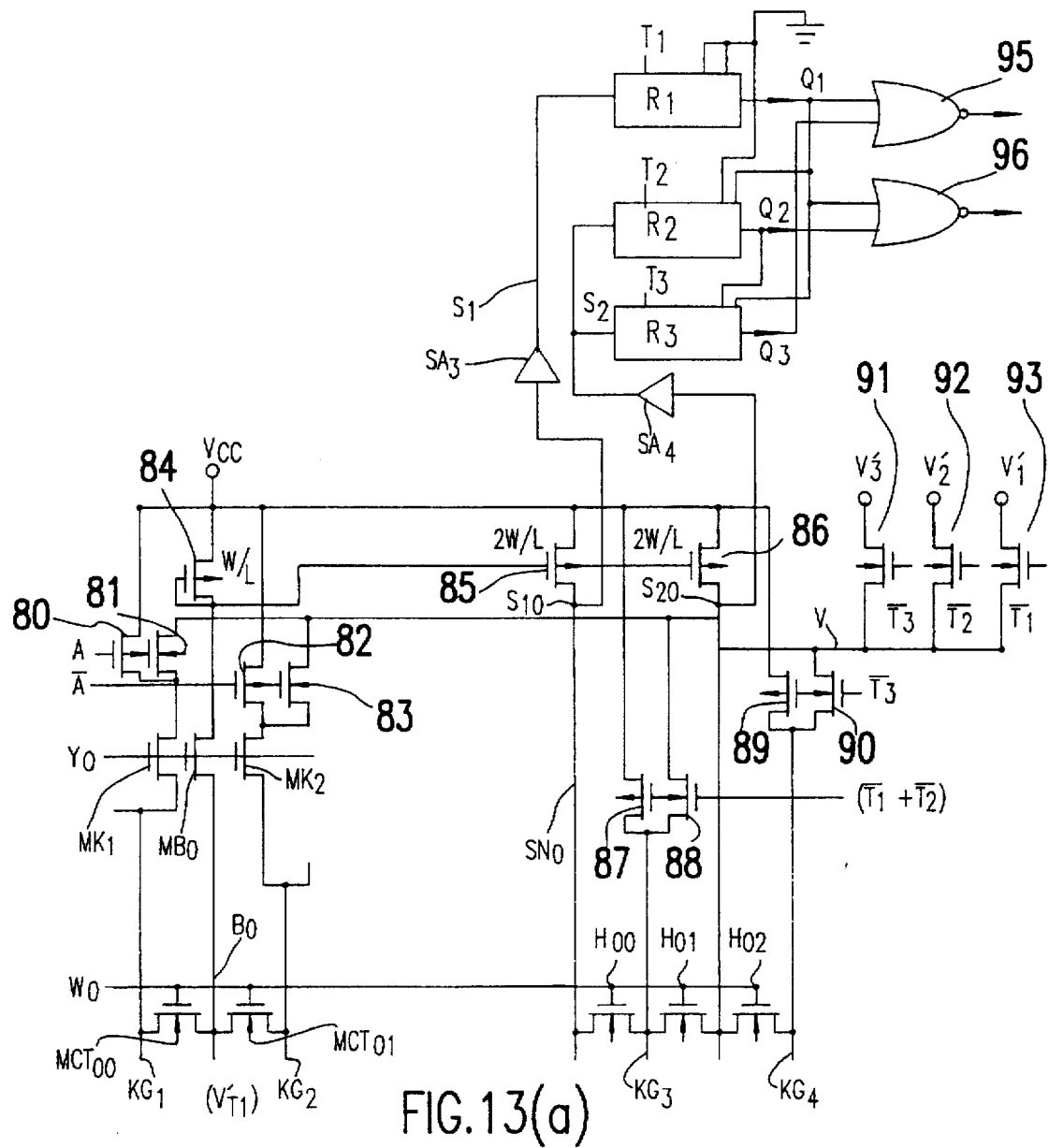
FIG. 13(a) is a circuit diagram of a part of the memory according to a fifth embodiment of the invention.
Figure 13B:
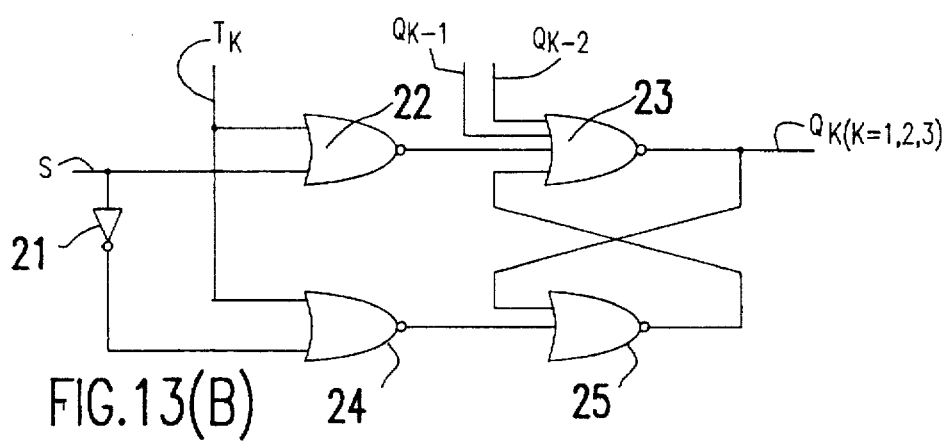
FIG. 13(b) is a circuit diagram of a part shown in FIG. 13(a)

In FIG. 13 is shown a circuit diagram of a fifth embodiment according to this invention. This embodiment discloses a circuit which discriminates the threshold of the memory transistor by varying the potential of the node V as in $V_1' \to V_2' \to V_3'$ by means of the timing signals $T_1$, $T_2$, and $T_3$. The blocking circuit of the memory in FIG. 13(a) is shown in FIG. 13(b). The connective relations of the memory transistors $MCT_{00}$, $MCT_{01}$ and the comparison transistors $H_{00}$, $H_{01}$, and $H_{02}$, the bit line $B_0$, the sense lines $SN_0$ and $SN_1$, the virtual ground lines KG1, KG2, and KG3 that are connected to the word line, are the same as in FIG. 10. The circuit for controlling the voltages of the virtual ground lines consist of the voltages $V_1'$, $V_2'$, and $V_3'$ and the transistors 91, 92, and 93 for switching these voltages, and the transistors 93, 92, and 91 are inputting the timing signals $T_1$, $T_2$, and $T_3$ to respective gates. In order to control the potential of the virtual ground line, a P-channel transistor 80 inputting the address signal to the gate and $V_{CC}$ to the drain, and an N-channel transistor 81 with its drain connected to the node V, are installed on the virtual ground line KG1. A pair of P-channel and N-channel transistors are similarly provided for respective virtual ground lines KG2, KG3, and KG4, and the inverse of A, the inverse of $T_1$+the inverse of $T_2$, and the inverse of $T_3$ are respectively connected to the gates of the pairs of the transistors. Transistors $MK_1$, $MB_0$, and $MK_2$ receiving commonly to their gates the Y selector output $Y_0$ controlling the access to the memory transistors are formed on the virtual ground line KG1, bit line $B_0$, and virtual ground line KG2, respectively. A transistor 84 with channel size W/L and transistors 85 and 86 with channel size 2W/L are provided on the bit line $B_0$, and the sense lines $SN_0$ and $SN_1$, respectively, with their gate connected in common. The outputs of the sense lines $SN_0$ and $SN_1$ are input to the blocking circuits $R_1$, $R_2$, and $R_3$ via sense amplifiers SA3 and SA4, respectively.

Figure 14:
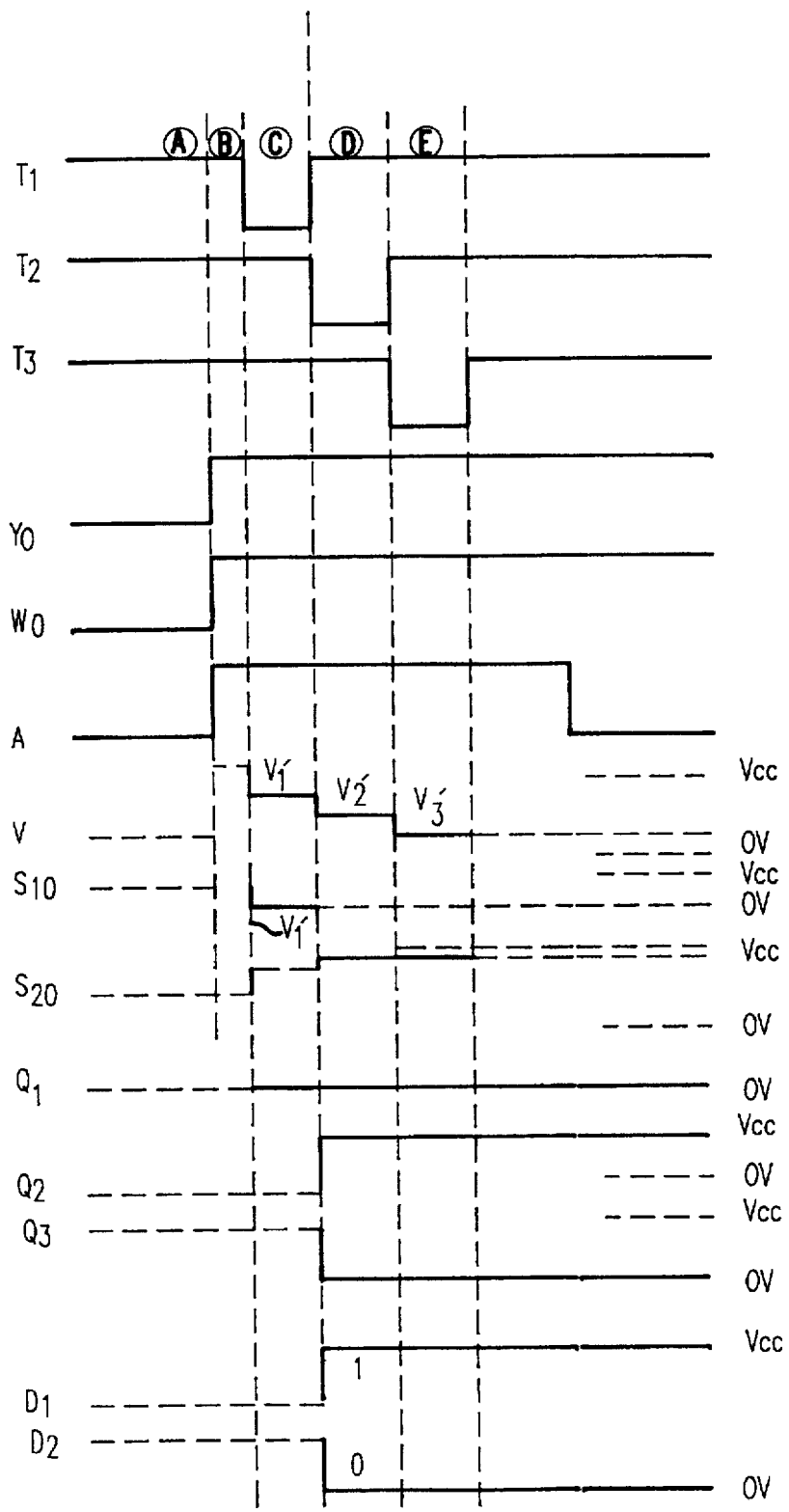
FIG. 14 is a timing chart of a part of the memory in the fifth embodiment of the invention.

Next, referring to FIG. 14, the operation of this circuit will be described. First, the timing signals $T_1$, $T_2$, and $T_3$ are all at H, and both the selector signal $Y_0$ and the word line $W_0$ are at L. (Period Ⓐ). Next, in order to carry out the read operation for the memory transistor $MCT_{00}$, the word line $W_0$, the selector signal $Y_0$, and the address signal A are brought to H. Then, the potential of the bit line $B_0$ goes to $V_{CC}-V_{Tn}$ and accompanying this the potential of the virtual ground line KG1 also goes up. (Period Ⓑ)

As the timing signal $T_1$ goes to L and $T_2$ and $T_3$ go to H, the potential of the node V and the virtual ground line KG1 go to $V_1'$. In addition, transistor 88 is turned on and the potential of the virtual ground line KG3 goes to $V_1'$. However, transistors 84, 85, and 86 are deenergized because the memory transistor $MCT_{00}$ with threshold $V'_{T1}$ is not energized Since the potential of the virtual ground line KG3 is $V_1$, the potential of the sense line $S_{10}$ goes close to $V_1'$, and $S_1$ which is amplified by the sense amplifier SA3 goes to L. The blocking circuit $R_1$ receives ($T_1$=L, $S_1$=L) and outputs $Q_1$=L. The outputs of the blocking circuits $R_2$ and $R_3$ are not definite since the timing signals $T_2$ and $T_3$ are at H. (Period Ⓒ)

As the timing signal $T_2$ goes to L and $T_1$ and $T_3$ go to H, the potentials of the node V and the virtual ground lines KG1 and KG3 go to $V_2'$. Thus, the memory transistor $MCT_{00}$ is energized, and a certain current $I_1$ flows in the transistor 84. Currents twice as large the current in the transistor 84 are expected to flow in the transistors 85 and 86. However, since the potential of the virtual ground line KG3 is $V_2'$, the comparison transistor $H_{01}$ can only let a current which is nearly equal to $I_1$ pass through it. Because of this, the potential of the $S_{20}$ approaches $V_{CC}$, and the sense amplifier SA4 outputs H. Since the level of $S_{10}$ is determined depending upon the magnitude of the current in $H_{00}$, it is unknown.

The blocking circuit $R_1$ holds $Q_1$=L since the timing signal $T_1$=L and $Q_1$=L in Period C. The blocking circuit $R_2$ latches $S_2$=H and $Q_1$=L with the timing signal $T_2$ and outputs $Q_2$=H. The blocking circuit $R_3$ receives $S_2$=H, but receives $Q_2$ (=H) as the reset input, so it is reset to $Q_3$=L. The NOR circuit 95 receives (L,L) and outputs data "1", and the NOR circuit 96 receives (L,H) and outputs data "0". (Period Ⓓ)

Since the timing signals $T_1$ and $T_2$ go to H and $T_3$ goes to L, the potential of the node V goes to $V_3'$. Since both the blocking circuits $R_1$ and $R_2$ receive H, they hold the outputs ($Q_1$, $Q_2$)=(L,H) in Period D regardless of the levels of $S_1$ and $S_2$. The blocking circuit $R_3$ receives H of $S_{20}$, but remains reset by $Q_2$=H, so it holds $Q_3$ at L. (Period Ⓔ)

From the operations in the above information of the memory transistor $MCT_{00}$ is read out to be (1,0). Next, by inverting the address signal A the read operation of the memory transistor $MCT_{01}$ is started. The read operation of the memory transistor $MCT_{01}$ is carried out by manipulating the timing signals in the same way as for the memory transistor $MCT_{00}$. Although the operation has been described in the above by assuming that the threshold of the memory transistor is $V'_{T1}$, there will be obtained (0,0), (0,1), and (1,1) as the outputs when the thresholds are $V'_{T0}$, $V'_{T2}$, and $V'_{T3}$, respectively.

Figure 15:
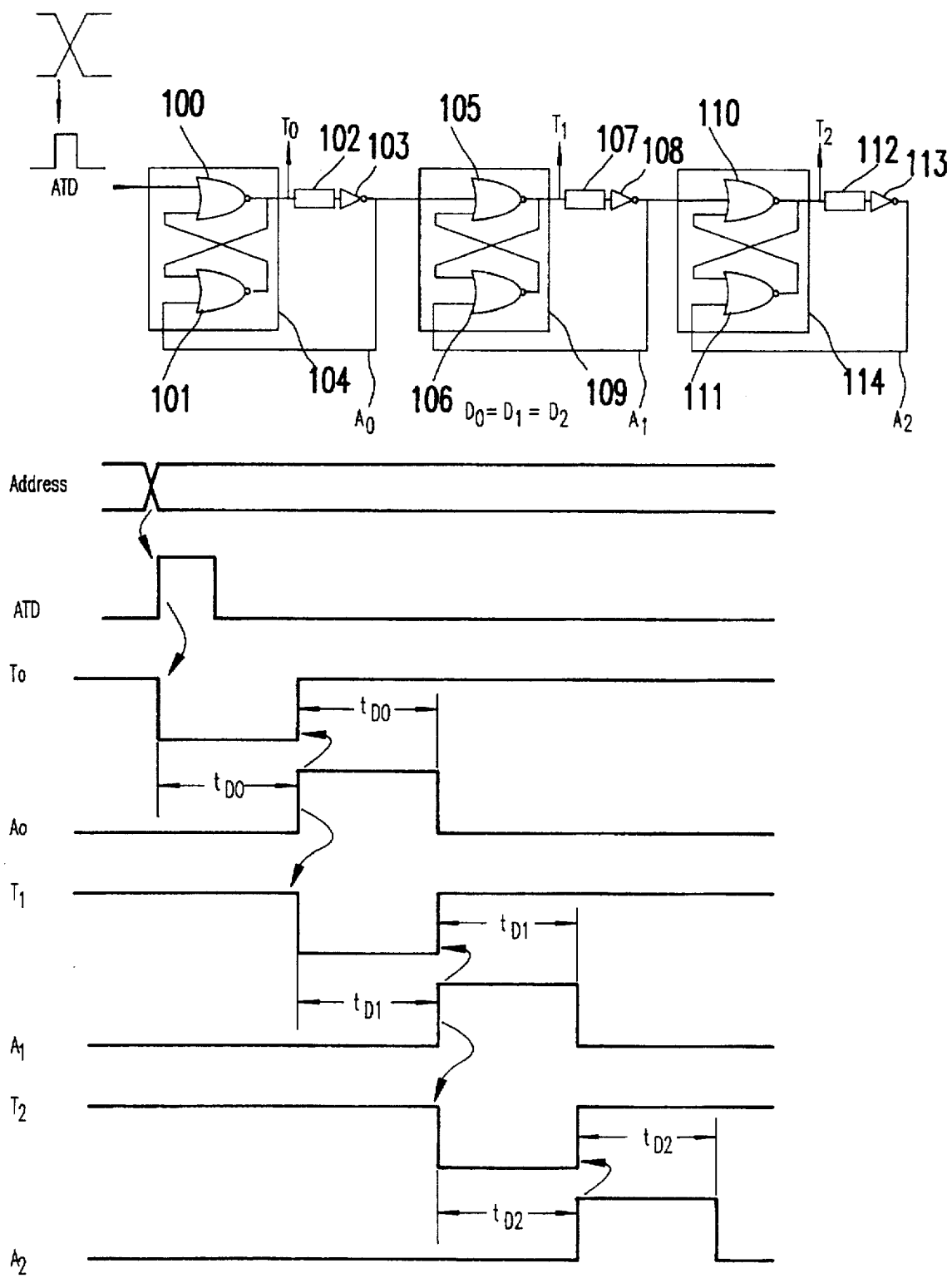
FIG. 15 is a pulse generating circuit used in this invention.

The timing signals $T_0$, $T_1$, and $T_2$ are generated by a pulse generating circuit as shown in FIG. 15. The pulse generating circuit comprises a plurality of timing signal producing circuit coupled in series. The 1st timing signal producing circuit receives a pulse ATD, generated by detecting a change in the address. The circuit comprises a flip-flop 104 formed by NOR circuits 100 and 101, and outputting the timing signal $T_0$, the delay circuit 102 inputting the timing signal to and outputting a delay signal, and an inverter circuit 103 inputting the delay signal and outputting an inverse signal to the flip-flop 104 in the preceding stage and the flip-flop 109 in the next stage.

Next, the operation of the timing signal generating circuit will be described. First, all the timing signals $T_i$ are set to "1" as the initial operation. Then, the input terminal of the flip-flop 104, other than the one receiving the pulse ATD, receives a low level signal. Next, the pulse ATD is input to one of the input terminals of the flip-flop 104. Then, the flip-flop 104 outputs a timing signal of low level based on the high level of the ATD signal. The timing signal of low level outputs a signal $A_0$ of high level after passing through the delay circuit 102 and the inverter circuit 103. This high level signal $A_0$ is input to the other terminal of the flip-flop 104 in the preceding stage, and as a result, a timing signal $T_1$ of high level is obtained. From the operation in the above, a timing signal $T_0$ having a pulse shape with a low level period $t_{D0}$ is generated. The output $A_0$ of the inverter circuit 103 is input to one of the terminals of the flip-flop 109 in the next stage, and the pulse generating circuit generates the timing signals $T_1$ and $T_2$ by the operation similar to the above. In this way, the timing signals $T_0$, $T_1$, $T_2$, are formed.

Figure 16:
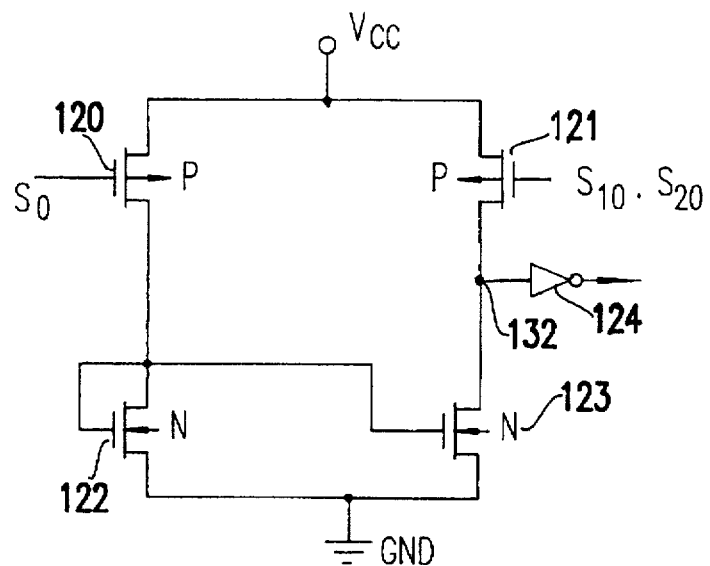
FIG. 16 is a sense amplifier used in the fourth and the fifth embodiment of the invention.

In FIG. 16 is shown a circuit diagram of the sense amplifier circuit SA. The output of the sense amplifier SA is controlled by the potential difference between the node $S_0$ in FIG. 10 and the node $S_{10}$ and $S_{20}$. The transistors 120 and 121, and the transistors 122 and 123 are formed to have the same sizes of W/L, respectively.

When the level of the node $S_0$ is lower than that of $S_{10}$ (or $S_{20}$), namely, when the selected memory transistor is energized, its output node 132 is at the L level, that is, the inverter 124 outputs the H level. On the contrary, when the level of the node $S_0$ is higher than that of $S_{10}$ (or $S_{20}$), namely, when the selected memory transistor is deenergized and a comparison transistor is energized, its output node 132 is the H level, that is, the inverter 124 outputs the L level.

Figure 17:
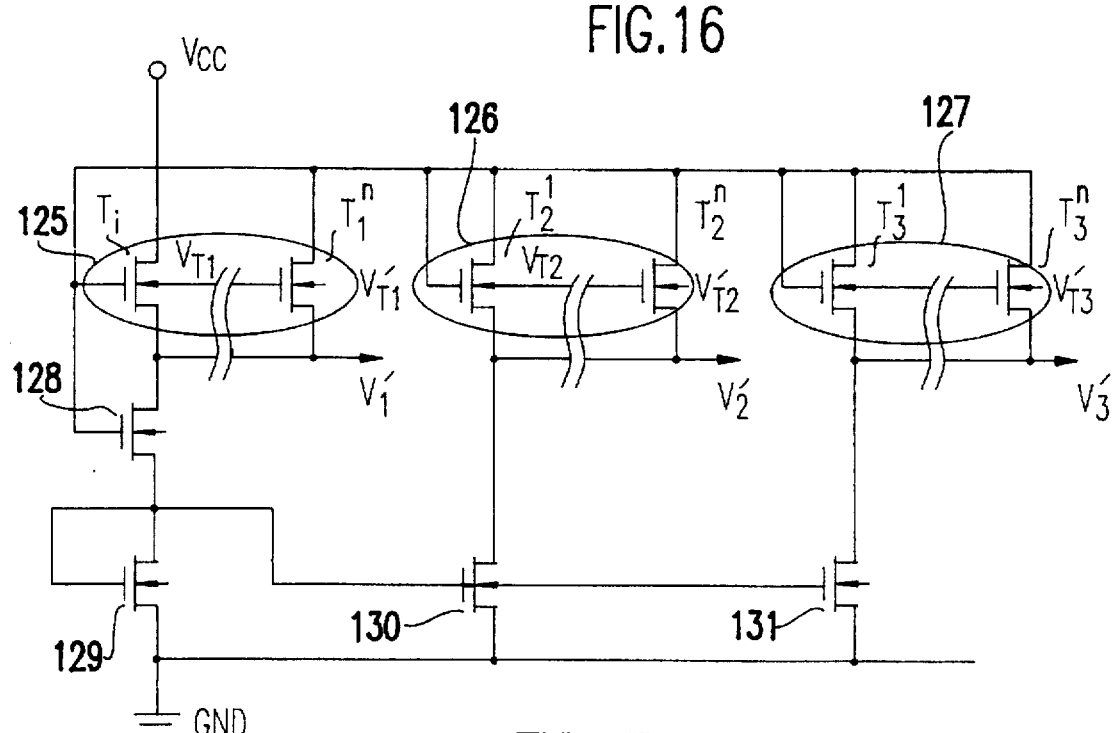
FIG. 17 is a constant voltage generating circuit used in the fourth and the fifth embodiments of the invention.
Figure 18:
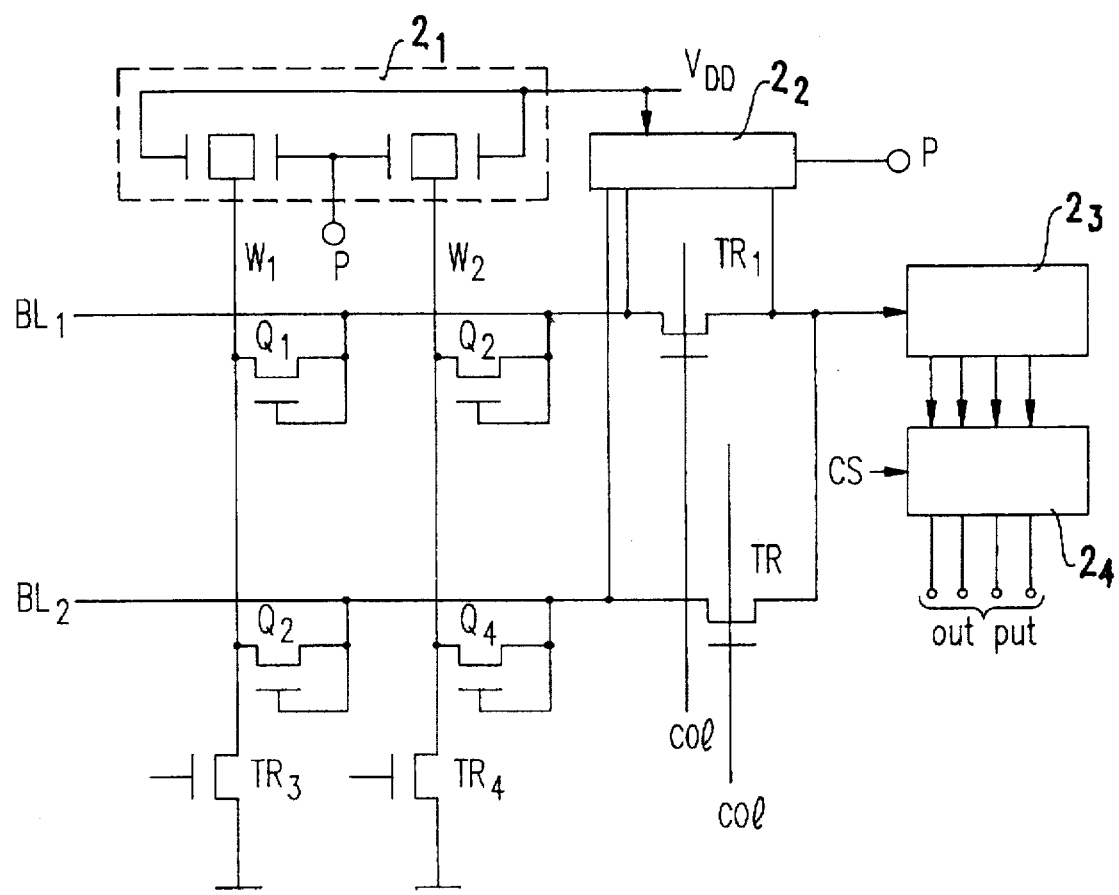
FIG. 18 is a circuit diagram of the first conventional multivalued memory cells.
Figure 19A:
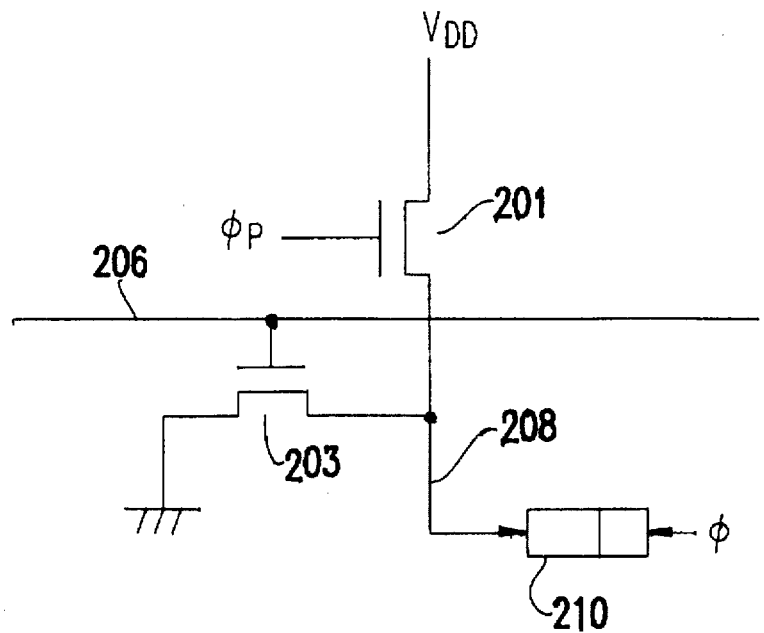
FIG. 19(a) is a circuit diagram of the second conventional multivalued memory cell.
Figure 19B:
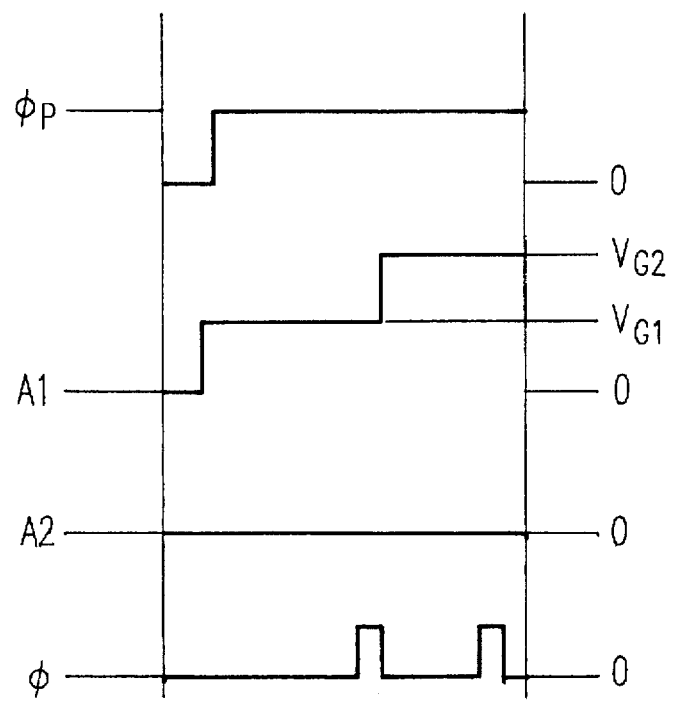
FIG. 19(b) is the timing chart for the circuit.

In FIG. 17 is shown the constant potential generating circuit used in the fourth and fifth embodiments. A plurality of transistors 125 having threshold $V'_{T1}$ are connected in parallel, the power supply voltage $V_{CC}$ is applied to the common drain end and a potential $V_1'$ is applied to the common source end, with all the gates connected to the power supply voltage $V_{CC}$. A plurality of transistors 126 having threshold $V'_{T2}$, and a plurality of transistors 127 having threshold $V'_{T3}$ with similar configuration as for the transistors 125 are also provided. A transistor 129 is provided between the sources of the plurality of transistors 125 and the ground potential GND, for inputting the power supply voltage $V_{CC}$ to these gates. The transistors 129, 130, and 131 are the same N-channel transistors with large channel width, and they are so constructed as to pass the current in the transistor 129 also in the transistors 130 and 131. Each of the groups of transistors 125, 126, and 127 consists of 10 to 100 or so transistors connected in parallel.

The virtual ground levels generated by this circuit are represented actually by $V_1'=V_{CC}-\alpha_0 V'_{T0}$, $V_2'=V_{CC}-\alpha_1 V'_{T1}$, and $V_3'=V_{CC}-\alpha_2 V'_{T2}$, and even when the separations between the consecutive thresholds are set equal, respective virtual ground levels are influenced by the back biases and have to be corrected. The respective amounts of correction are represented by the relation $\alpha_0 > \alpha_1 > \alpha_2 > 1$, and when $V'_{T0}=1V$, for example, $\alpha_1=1.5$ or so.

This invention is not limited to the embodiments in the above, and various modifications of the disclosed embodiments are possible within the scope of the invention. For example, instead of the system in which the potentials of the word line and the virtual ground lines are varied stepwise, a system may be adopted in which they are varied continuously. However, such a system requires high precision matching of the rates of rise and fall with the timings of $T_1$, $T_2$, and $T_3$, and as a result, it will be found that it is necessary to slow down the rates of rise and fall to one half of that of the system in which stepwise driving is employed, and to increase the timing margins.

In the read system of a read only memory according to this invention, sensing is accomplished by the states of energization of the memory transistor and the comparison transistors, with no need for waiting until the completion of discharge of the digit line, so that it has an effect of increasing the read rate.

Since the output is determined based on the difference between the currents in the memory transistor and the comparison transistor, it can be read correctly even when the level of the word line or the virtual ground line fluctuates.

The embodiment 3 has an effect that the number of transistors involved is smaller and the timing management is simpler compared with the embodiment 1.

The embodiment 4 employs a read system of a multilevel memory transistor in which virtual ground lines consisting of aluminum wirings are driven. Therefore, it has an effect that there is no need for worrying about the time delay of the aluminum wirings, and facilitates the design and manufacture. Moreover, the number of X decoders can be reduced because of the negligible time delay, and hence it has an effect that the chip can be miniaturized. Furthermore, a system is applied in which the level of the virtual ground line is adjusted upward or downward after temporarily setting it to an intermediate level, so that it has an effect of enabling the decision of four values during the period of timing signals $T_1$ and $T_2$.

The embodiment 5 has an effect that it can be constructed with a configuration simpler than that of the embodiment 3.

What is claimed is:

1. A semiconductor memory device comprising at least one word line, at least one memory transistor having a gate connected to said word line and a threshold level selected from a plurality of reference threshold levels, a plurality of comparison transistors each having a gate connected to said word line and a threshold level selected from said reference threshold levels, the threshold levels of said comparison transistors being different from each other, a driving circuit driving said word line with respective ones of driving voltages, at least one of said comparison transistors being rendered conductive each time said word line is driven with either one of said driving voltages, said memory transistor being rendered conductive when said word line is driven with such a driving voltage that exceeds the threshold level of said memory transistor, and means coupled to said memory transistor and said comparison transistors for generating output data consisting of a plurality of bits representative of the threshold level of said memory transistor in response to conductive and non-conductive states of said memory transistor and said comparison transistors.

2. The device as claimed in claim 1, wherein said driving circuit includes a timing signal generator generating in sequence a plurality of timing signals and a driver driving said word line with each of said driving voltages in response to an associated one of said timing signals.

3. The device as claimed in claim 2, wherein said means includes a switching circuit selecting each of said comparison transistors in response to an associated one of said timing signals, a current circuit responding to a first current relative to a current flowing through said memory transistor and a second current relative to a current flowing through one of said comparison transistors selected by said switching circuit and producing a logic level, and a data generator responding to said logic level and generating said output data.

4. The device as claimed in claim 3, wherein said current circuit comprises a current mirror circuit, said current mirror circuit including an output transistor coupled to said memory transistor and a plurality of input transistors coupled to said comparison transistors, respectively, and said switching circuit includes a plurality of switching transistors each coupled between said output transistor and an associated one of said input transistors and rendered conductive in response to an associated one of said timing signals.

5. The device as claimed in claim 3, wherein said current circuit includes an output transistor coupled to said memory transistor and an input transistor coupled to said output transistor, and said switching circuit includes a plurality of switching transistors each coupled between said input transistor and an associated one of said comparison transistors and rendered conductive in response to an associated one of said timing signals.

6. The device as claimed in claim 2, wherein said means includes a current mirror circuit having an input node coupled to said memory transistor and a plurality of output nodes coupled to said comparison transistors, respectively, and a logic circuit coupled to said output nodes to generate said output data.

7. A semiconductor memory comprising at least one word line, at least one memory transistor having a gate connected to said word line and a threshold level selected from a plurality of reference threshold levels, a plurality of comparison transistors having respective gates connected to said word line, each of said comparison transistors having a threshold level selected from said reference threshold levels and the threshold levels of said comparison transistors being different from each other, a voltage driving circuit driving said word line with respective ones of a plurality of driving voltages, and a sensing circuit connected to said memory transistor and said comparison transistors which holds the logical level state based on the difference between the current flowing in said memory transistor and the current flowing in said transistor circuit whenever driving to respective values of said plurality of voltages takes place, and outputs multibit data stored in said memory transistor based on the logical level state held.

8. The semiconductor memory as claimed in claim 7, wherein said voltage driving circuit selects one of a plurality of potentials generated from a potential generating circuit by a timing signal and outputs the selected potential when a specified level is formed by the combination of addresses.

9. The semiconductor memory as claimed in claim 8, wherein said potential generating circuit comprises an output terminal, a current source connected to a first voltage source terminal and to said output terminal, and a plurality of level shift circuits, each of said level shift circuits connected to said output terminal and to a second voltage source terminal.

10. The semiconductor memory as claimed in claim 8, wherein said timing signal is produced by a pulse generating circuit comprising nth timing signal producing circuit coupled in series (n being integer that is 2 or more), said 2nd and more timing signal producing circuit inputting an input signal and outputting said timing signal and an output signal, said timing signal changing from a first level to a second level by inputting said input signal and changing from said second level to said first level by changing said output signal from said second level to said first level, said output signal changing from said second level to said first level after a predetermined period since said timing signal changes from said first level to said second level and changing from said first level to said second level after said predetermined period since said timing signal changes from said second level to said first level, said 1st signal producing circuit inputting an ATD signal generated by detecting a change in the address as said input signal.

11. The semiconductor memory as claimed in claim 10, wherein said signal producing circuit comprises a flip flop inputting said output signal thereof and an output signal of a previous signal producing circuit, a delay circuit inputting an output of said flip flop, an and inverter inputting an output of said delay circuit and outputting said second signal.

12. The semiconductor memory as claimed in claim 7, wherein said sensing circuit is constituted of a current mirror circuit having unequal input and output currents which uses a transistor on the side of said memory transistor as an input or output and uses correspondingly a transistor on the side of said comparison transistor as an output or input.

13. The semiconductor memory as claimed in claim 12, wherein said current mirror circuit comprises a first transistor whose source is connected to said memory transistor, and a second transistor whose source is connected to said comparison transistor and forming a ratio of channel length and channel width different from that of said memory transistor.

14. A semiconductor memory comprising at least one word line, at least one memory transistor having a gate connected to said word line and a threshold level selected from a plurality of reference threshold levels, a plurality of comparison transistors having respective gates connected to said word line, each of said comparison transistors having a threshold level selected from said reference threshold levels and the threshold levels of said comparison transistors being different from each other, a first virtual ground line connected to one of the drain and source of said comparison transistor, a sense line connected to the other of the drain and source of said comparison transistor, a bit line connected to one of the drain and source of said memory transistor, a second virtual ground line connected to the other of the drain and source of said memory transistor, a voltage driving circuit respectively driving said first and second virtual ground lines with respective ones of a plurality of driving voltages, and sensing means consisting of current mirror circuits using said bit line and respective members of said plurality of sense lines as the inputs and outputs, holding the logical level state based on the difference between the current flowing in said memory transistors and the current flowing in said transistor circuit whenever said first and second virtual ground lines drive to respective ones of said plurality of voltages, and outputting multibit data stored in said memory transistors based on the logical level state held.

15. The semiconductor memory as claimed in claim 14, wherein said voltage driving circuit selects one of a plurality of potentials generated from a potential generating circuit by a timing signal and outputs the selected potential when a specified level is formed by the combination of addresses.

16. The semiconductor memory as claimed in claim 15, wherein said timing signal is produced by a pulse generating circuit comprising nth timing signal producing circuit coupled in series (n being integer that is 2 or more), said 2nd and more timing signal producing circuit inputting an input signal and outputting said timing signal and an output signal, said timing signal changing from a first level to a second level by inputting said input signal and changing from said second level to said first level by changing said output signal from said second level to said first level, said output signal changing from said second level to said first level after a predetermined period since said timing signal changes from said first level to said second level and changing from said first level to said second level after said predetermined period since said timing signal changes from said second level to said first level, said 1st signal producing circuit inputting an ATD signal generated by detecting a change in the address as said input signal.

17. The semiconductor memory as claimed in claim 15, wherein said potential generating circuit comprises an output terminal, a current source connected to a first voltage source terminal and to said output terminal, and a plurality of level shift circuits, each of said level shift circuits connected to said output terminal and to a second voltage source terminal.

18. The semiconductor memory as claimed in claim 14, wherein said sensing circuit is constituted of a current mirror circuit having unequal input and output currents which uses a transistor on the side of said memory transistor as an input or output and uses correspondingly a transistor on the side of said comparison transistor as an output or input.

19. The semiconductor memory as claimed in claim 18, wherein said current mirror circuit comprises a first transistor whose source is connected to said memory transistor, a second transistor and whose source is connected to said comparison transistor and producing a ratio of channel length and channel width different from that of said memory transistor.

20. The semiconductor memory as claimed in claim 14, wherein said sensing means further comprises a sensing circuit comparing the potential of said bit line with the potential of said sense line, and outputs a signal of a first logical level when the potential of said bit line is higher than the potential of said sense line and outputs a signal of a second logical level when the potential of said bit line is lower than the potential of said sense line.

* * * * *